(12) United States Patent
Rasalingam et al.

(10) Patent No.: US 12,237,275 B2
(45) Date of Patent: Feb. 25, 2025

(54) SEMICONDUCTOR DEVICES HAVING SUPPORTIVE PLATING STRUCTURES

(71) Applicant: Western Digital Technologies, Inc., San Jose, CA (US)

(72) Inventors: Uthayarajan A/L Rasalingam, Penang (MY); Janice Jia Min Ling, Penang (MY)

(73) Assignee: Western Digital Technologies, Inc., San Jose, CA (US)

( * ) Notice: Subject to any disclaimer, the term of this patent is extended or adjusted under 35 U.S.C. 154(b) by 357 days.

(21) Appl. No.: 17/675,951

(22) Filed: Feb. 18, 2022

(65) Prior Publication Data
US 2023/0268290 A1 Aug. 24, 2023

(51) Int. Cl.
| | | |
|---|---|---|
| *H01L 21/00* | (2006.01) | |
| *H01L 23/00* | (2006.01) | |
| *H01L 23/31* | (2006.01) | |
| *H01L 23/367* | (2006.01) | |
| *H01L 23/48* | (2006.01) | |
| *H01L 23/49* | (2006.01) | |

(Continued)

(52) U.S. Cl.
CPC ........ *H01L 23/562* (2013.01); *H01L 23/3128* (2013.01); *H01L 23/3677* (2013.01); *H01L 23/481* (2013.01); *H01L 23/49* (2013.01); *H01L 23/5286* (2013.01); *H01L 25/0657* (2013.01); *H01L 2225/0651* (2013.01); *H01L 2225/06548* (2013.01); *H01L 2225/06562* (2013.01); *H01L 2225/06586* (2013.01); *H01L 2225/06589* (2013.01)

(58) Field of Classification Search
CPC ............... H01L 23/562; H01L 23/3128; H01L 23/3677
See application file for complete search history.

(56) References Cited

U.S. PATENT DOCUMENTS 5,952,843 A * 9/1999 Vinh .................. G01R 1/07357
324/754.07
6,583,513 B1 * 6/2003 Utagikar ............. H01L 23/3677
257/E23.105

(Continued)

FOREIGN PATENT DOCUMENTS

| AU | 2009200888 A1 * | 1/2010 | ............ H01J 31/507 |
| CA | 2653159 A1 * | 1/2010 | ............ H01J 31/507 |

(Continued)

*Primary Examiner* — Laura M Menz
(74) *Attorney, Agent, or Firm* — Morgan, Lewis & Bockius LLP

(57) ABSTRACT

A semiconductor package includes a substrate having a first surface, and a second surface opposite the first surface. The substrate includes a connection region having a first array of contact pads, and a peripheral region surrounding the connection region and having additional contact pads. A semiconductor die having an array of electrical contacts and thermal contacts, is connected to the first array of contact pads and to the additional contact pads. A plate is coupled to a top surface of the semiconductor die and there is at least one pin projecting from the plate toward the first substrate. The pin is disposed within a channel that extends between the plate and the additional contact. The plate, channel and pin improve the heat dissipation capabilities of the semiconductor device package.

17 Claims, 10 Drawing Sheets

(51) Int. Cl.
  *H01L 23/528* (2006.01)
  *H01L 25/065* (2023.01)

(56) References Cited

U.S. PATENT DOCUMENTS

| | | | | |
|---|---|---|---|---|
| 6,736,553 | B1 * | 5/2004 | Stiehl | G02B 6/4246 |
| | | | | 385/92 |
| 7,317,247 | B2 | 1/2008 | Lee et al. | |
| 7,986,048 | B2 * | 7/2011 | Park | H01L 24/97 |
| | | | | 257/774 |
| 8,334,601 | B2 * | 12/2012 | Park | H01L 25/105 |
| | | | | 257/676 |
| 8,598,034 | B2 * | 12/2013 | Park | H01L 23/49827 |
| | | | | 438/667 |
| 2006/0043986 | A1 * | 3/2006 | Hembree | G01R 1/07357 |
| | | | | 324/754.03 |
| 2007/0200575 | A1 * | 8/2007 | Hembree | G01R 1/07357 |
| | | | | 324/762.05 |
| 2009/0072384 | A1 * | 3/2009 | Wong | H01L 25/0655 |
| | | | | 257/E23.101 |
| 2009/0115050 | A1 * | 5/2009 | Kasuya | H01L 23/3677 |
| | | | | 257/701 |
| 2010/0207262 | A1 * | 8/2010 | Park | H01L 21/6835 |
| | | | | 438/126 |
| 2011/0254172 | A1 * | 10/2011 | Park | H01L 24/82 |
| | | | | 257/774 |
| 2013/0075933 | A1 * | 3/2013 | Park | H01L 21/6835 |
| | | | | 438/118 |
| 2014/0063742 | A1 | 3/2014 | Carpenter, Jr. et al. | |
| 2014/0266274 | A1 * | 9/2014 | Shiraishi | G01R 1/07357 |
| | | | | 324/750.25 |
| 2015/0276201 | A1 * | 10/2015 | Kim | F21V 29/83 |
| | | | | 362/249.03 |
| 2019/0115325 | A1 * | 4/2019 | Im | H01L 23/3675 |
| 2020/0219860 | A1 * | 7/2020 | Im | H01L 23/49816 |
| 2023/0268290 | A1 * | 8/2023 | Rasalingam | H01L 23/3677 |
| | | | | 257/668 |
| 2023/0371209 | A1 * | 11/2023 | Rasalingam | H05K 7/20509 |

FOREIGN PATENT DOCUMENTS

| | | | | | |
|---|---|---|---|---|---|
| CN | 102064265 | B | * | 1/2013 | |
| CN | 108628488 | A | * | 10/2018 | ........... G02F 1/1309 |
| CN | 107919345 | B | * | 4/2023 | ........... H01L 21/486 |
| EP | 3909073 | B1 | * | 3/2024 | ........... G01K 1/143 |
| JP | 3726318 | B2 | * | 12/2005 | ........... H01L 23/3114 |
| JP | 3802936 | B2 | * | 8/2006 | ........... H01L 21/568 |
| JP | 4422494 | B2 | * | 2/2010 | ........ G06K 19/07732 |
| WO | WO-9949329 | A1 | * | 9/1999 | ........ G01R 1/07357 |

\* cited by examiner

SEMICONDUCTOR DEVICES HAVING SUPPORTIVE PLATING STRUCTURES

BACKGROUND

The present disclosure generally relates to packaging for semiconductor devices including supporting plating structures and, more particularly, to a semiconductor device having support plates for improved heat transfer and/or for preventing or reducing warpage caused by thermal expansion.

Semiconductor devices generate heat resulting from continued use of the semiconductor device and are commonly exposed to high temperatures during assembly. For instance, existing semiconductor devices and/or semiconductor device packages may generate excessive amounts of heat. As packages continue to decrease in size, the heat dissipation capabilities of said packages decreases.

Additionally, during assembly, semiconductor devices are often exposed to high temperatures that often lead to warping of the semiconductor device. For example, different components of semiconductor devices often are made of materials having varying coefficients of thermal expansion (CTE). As such, when exposed to high temperatures or excess heat (e.g., during reflow soldering), some of the components may expand more than other components resulting in a warping of the semiconductor device. Existing solutions for preventing warping are only useful after soldering of the semiconductor device has taken place, and are not useful prior to or during the soldering process. However, soldering of the semiconductor device exposes the components to high temperatures that often lead to warping.

Therefore, there is a need to provide semiconductor packages that include supportive plating structures configured to dissipate heat and/or supportive plating structures configured to prevent or reduce warping due to thermal expansion.

SUMMARY

In one embodiment there is a semiconductor device package including a substrate including a first surface, and a second surface opposite the first surface, the substrate having a connection region including a first array of contact pads, and a peripheral region surrounding the connection region and including at least one additional contact pad. The semiconductor device package further includes a semiconductor die including an array of electrical contacts and at least one thermal contact, the array of electrical contacts connected to the first array of contact pads and the at least one thermal contact connected to the at least one additional contact pad. The semiconductor device package further includes a plate coupled to a top surface of the semiconductor die, and at least one pin projecting from the plate toward the first substrate, the at least one pin being disposed within a channel that extends between the plate and the at least one additional contact.

In some embodiments, the channel extends through the semiconductor die. In some embodiments, the channel extends through a through silicon via (TSV) of the semiconductor die. In some embodiments, the at least one additional contact pad includes a ground pad. In some embodiments, the at least one additional contact pad includes two additional contact pads and the at least one pin includes two pins, each of the two pins extending between the plate and the corresponding two additional contact pads.

In some embodiments, the two additional contact pads are connected to an electrical ground.

In another embodiment, there is a semiconductor device package including a first substrate including a first surface, and a second surface opposite the first surface, the first substrate having a connection region and a peripheral region surrounding the connection region, and a semiconductor die electrically connected to the first substrate and positioned within the connection region of the first surface. The semiconductor device package further includes an encapsulant covering the semiconductor die and at least a portion of the peripheral region, the encapsulant having an outer surface comprising a top surface and a plurality of side surfaces substantially perpendicular to the top surface. The semiconductor device package further includes a plate coupled to the top surface of the encapsulant, and at least one pin projecting from the plate toward the first substrate, the at least one pin being disposed within a channel that extends through the encapsulant and at least partially through the second surface of the first substrate in the peripheral region.

In some embodiments, the semiconductor device package further includes a second substrate having one or more signal traces and one or more thermal traces, the one or more signal traces being electrically isolated from the one or more thermal traces, at least one contact disposed on the first surface of the first substrate within the connection region and configured to provide electrical communication between the semiconductor die and the one or more signal traces of the second substrate, and at least one additional contact disposed on the first surface of the first substrate within the peripheral region and configured to provide thermal communication between the plate and the one or more thermal traces of the second substrate.

In some embodiments, the at least one additional contact is connected to an additional contact pad on the first surface of the first substrate, and wherein the channel extends from the plate to the additional contact pad. In some embodiments, the semiconductor device package further includes a thermally conductive material at least partially lining an internal wall of the channel, and wherein the at least one pin is in contact with the thermally conductive material. In some embodiments, the at least one electrical contact includes a first set of solder balls electrically coupled to the semiconductor die and the one or more signal traces, and wherein the at least one thermal contact includes a second set of solder balls electrically isolated from the semiconductor die. In some embodiments, the second substrate includes a first set of bond pads in direct contact with the first set of solder balls and a second set of bond pads in direct contact with the second set of solder balls, wherein the first set of bond pads is connected to the one or more signal traces, and wherein the second set of bond pads is connected to the one or more thermal traces. In some embodiments, the one or more thermal traces at least partially surround the first set of bond pads on the second substrate. In some embodiments, the semiconductor device package further includes a housing at least partially enclosing the semiconductor die, the first substrate, and the second substrate, and wherein the one or more thermal traces provide a thermally conductive pathway from the at least one thermal contact to the housing. In some embodiments, the housing is secured to the second substrate by at least one fastener, wherein the second substrate includes at least one fastener hole for receiving the at least one fastener, and wherein the one or more thermal traces include a portion that abuts the at least one fastener hole. In some embodiments, the at least one fastener is in thermal communication with the one or more thermal traces when the at least one fastener is received in the at least one fastener hole.

In another embodiment, there is a semiconductor device package including a first substrate including a first surface, and a second surface opposite the first surface, the first substrate having a connection region and a peripheral region surrounding the connection region. The semiconductor device package further includes a semiconductor die electrically connected to the first substrate and positioned on the connection region, and an encapsulant covering the semiconductor die and at least a portion of the peripheral region, the encapsulant having an outer surface comprising a top surface and a plurality of side surfaces substantially perpendicular to the top surface. the semiconductor device package further includes a reinforcement layer disposed over the outer surface of the encapsulant, the reinforcement layer including a plate coupled to the top surface of the encapsulant and a peripheral wall abutting the plurality of side surfaces of the encapsulant. The semiconductor device package further includes a second substrate positioned below the first substrate, and a second semiconductor die positioned on the second substrate between the first substrate and the second substrate. The semiconductor device package further includes at least one pin extending from the plate through the encapsulant and through the first substrate within the peripheral region, wherein the at least one pin extends from the plate through the first substrate to the second substrate within the peripheral region around the second semiconductor die.

In some embodiments, the at least one pin comprises a plurality of pins spaced around the semiconductor die and projecting from the plate toward the first substrate, each of the plurality of pins extending through the first surface of the first substrate to the second surface of the first substrate within the peripheral region. In some embodiments, the plurality of pins are disposed between the side surfaces of the encapsulant and the semiconductor die. In some embodiments, the plurality of pins are positioned and configured to limit thermal expansion of the encapsulant between the plurality of pins and the peripheral wall.

BRIEF DESCRIPTION OF THE DRAWINGS

The foregoing summary, as well as the following detailed description, will be better understood when read in conjunction with the appended drawings. For the purpose of illustrating the present disclosure, there are shown in the drawings embodiments which are presently preferred, wherein like reference numerals indicate like elements throughout. It should be noted, however, that aspects of the present disclosure can be embodied in different forms and thus should not be construed as being limited to the illustrated embodiments set forth herein. The elements illustrated in the accompanying drawings are not necessarily drawn to scale, but rather, may have been exaggerated to highlight the important features of the subject matter therein. Furthermore, the drawings may have been simplified by omitting elements that are not necessarily needed for the understanding of the disclosed embodiments.

In the drawings.

DETAILED DESCRIPTION

The present subject matter will now be described more fully hereinafter with reference to the accompanying Figures, in which representative embodiments are shown. The present subject matter can, however, be embodied in different forms and should not be construed as limited to the embodiments set forth herein. Rather, these embodiments are provided to describe and enable one of skill in the art.

Figure 1A:
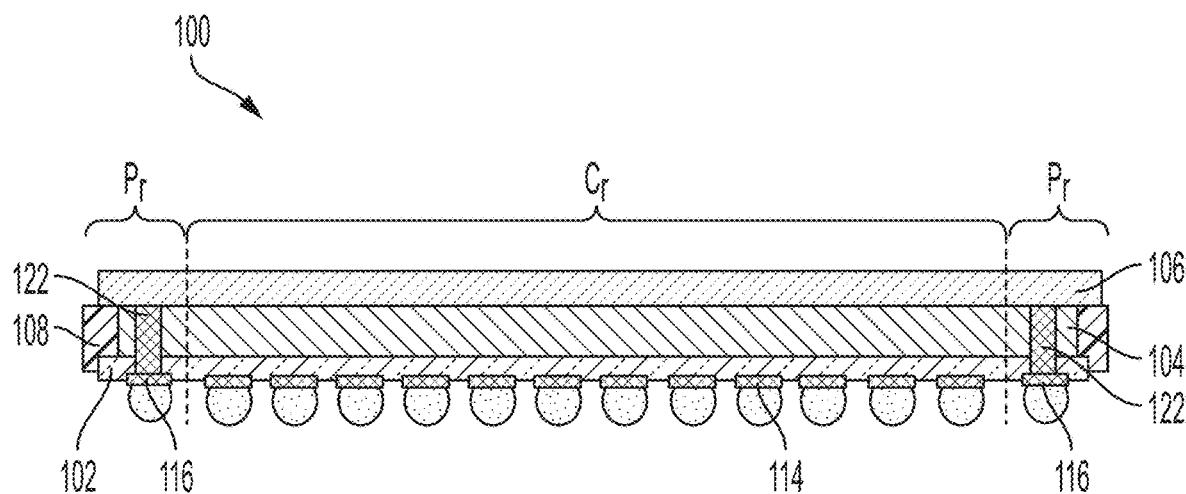
FIG. 1A is a side cross-sectional illustration of a semiconductor device package having a semiconductor device and a thermally conductive plate coupled thereto in accordance with an exemplary embodiment of the present disclosure.
Figure 1B:
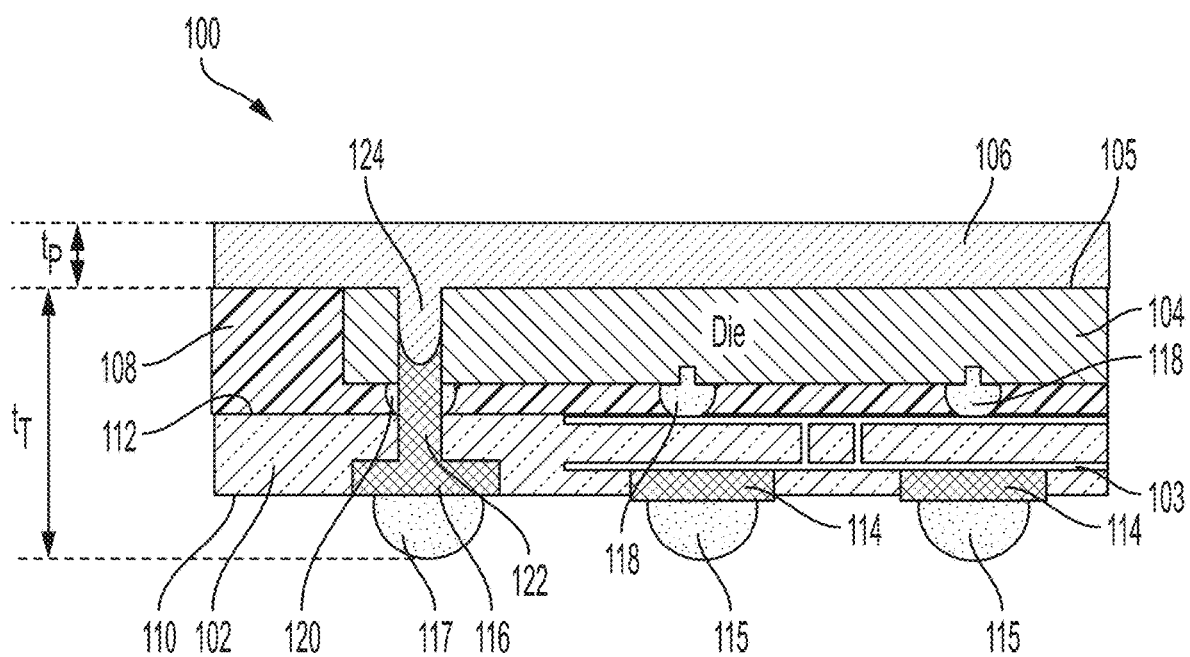
FIG. 1B is a magnified cross-sectional illustration of the semiconductor device package of FIG. 1A.

Referring to FIGS. 1A-1B, there is shown a semiconductor device package, generally designated 100, including a thermally conductive plate in accordance with an exemplary embodiment of the present disclosure. The semiconductor device package 100 may include a substrate 102, a semiconductor die 104 coupled to the substrate, and a plate 106 coupled to the semiconductor die 104. At least a portion of the semiconductor die 104 may be encapsulated by an encapsulant 108. The encapsulant 108 may include, for example, an epoxy molding compound (EMC) or another encapsulant material known in the art. In some embodiments, the semiconductor die 104 is a memory die such as, but not limited to, a NAND die. In some embodiments, the semiconductor die 104 may be, for example, a controller die, an application-specific integrated circuit (ASIC) die, or other integrated circuit (IC) die. The substrate 102 may be a mechanical base support for the semiconductor die 104 and an electrical interface (or electrical circuit) that provides access to the semiconductor die 104 included in the semiconductor device package 100. For example, the substrate 102 may include one or more electrically conductive layers/traces 103 disposed within the substrate 102, including at least one layer for routing data using conductive (e.g., copper) traces, a ground layer, and/or a power layer.

The substrate 102 may include a first surface 110 (e.g., a bottom surface) and a second surface 112 (e.g., a top surface). The first surface 110 may be opposite the second surface 112. In some embodiments, the first surface 110 and second surface 112 are substantially parallel to one another. The semiconductor die 104 may be mounted to the second surface 112 of the substrate 102. In some embodiments, there may be an array of contact pads 114 in electrical communication with substrate 102 and positioned within a connection region $C_r$. The array of contact pads 114 may be coupled to the first surface 110 of substrate 102. In some embodiments, the array of contact pads 114 includes a plurality of solder balls. In some embodiments, the array of contact pads 114 is electrically coupled to the semiconductor die 104 via substrate 102. In this manner, electrical signals may be transmitted from the semiconductor die, to the array of contact pads 114 in the connection region $C_r$ via the substrate 102 or vice versa.

In some embodiments, there are one or more additional contact pads 116 coupled to the substrate 102. The one or more additional contact pads 116 may be positioned within a peripheral region $P_r$ that surrounds the connection region $C_r$. The peripheral region $P_r$ may be a region of the semiconductor device package 100 that extends outwardly from the connection region $C_r$ to the periphery of the semiconductor device package 100. In this manner, the connection region $C_r$ may be surrounded by the peripheral region $P_r$ without any overlap existing between the two regions. In some embodiments, the connection region $C_r$ may represent a region on the semiconductor device package 100 wherein one or more pathways and/or connections exist that are intended to transmit electrical signals to and from the semiconductor device package 100 to other external devices. The peripheral region $P_r$ may represent a region of the semiconductor device package 100 that is separate and distinct from the connection region $C_r$, wherein one or more thermal pathways and/or connections exist that are intended to transfer heat from the semiconductor device package 100 to an external housing and/or the external environment. In some embodiments, the one or more additional contact pads 116 positioned within the peripheral region $P_r$ are electrically isolated from the array of contact pads 114 that are positioned within the connection region $C_r$. In some embodiments, the one or more additional contact pads 116 are electrically isolated from semiconductor die such that they do not receive or transmit electrical signals from semiconductor die 104.

In some embodiments, there may be one or more electrical contacts 115 and one or more additional contacts 117 coupled to the substrate 102. The one or more electrical contacts 115 and one or more additional contacts 117 may be coupled to the bottom planar surface 110 of the substrate 102 via the contacts pads 114, 116 respectively. The one or more additional contacts 117 may be positioned within the peripheral region $P_r$ and the one or more electrical contacts 115 may be positioned within the connection region $C_r$. In some embodiments, the additional contacts 117 are electrically isolated from the electrical contacts 115. In some embodiments, the one or more additional contact pads 116 that couple the additional contacts 117 to the substrate 102 may have a width that is greater than the any individual additional contact 117. For example, the additional contacts 117 may have a first width and the additional contact pad 116 that the additional contact 117 is coupled to may have a second width that is up to about 30% greater than the first width. In other embodiments, the additional contact pad 116 may have a width that is less than or equal to the width of the additional contact 117 and there may be a second additional contact pad positioned between the channel 122 and additional contact pad 116. The second additional contact pad may have a width that is up to about 30% greater than the width of the additional contact 117.

In some embodiments, the semiconductor die 104 includes an array of electrical contacts 118 configured to electrically couple the semiconductor die 104 to one or more components of the semiconductor device package 100. For example, the semiconductor die 104 may include electrical contacts 118 electrically connected to the semiconductor die 104 and to the substrate 102. In this manner, the array of electrical contacts 118 may electrically connect the semiconductor die 104 to the substrate 102. In some embodiments, the array of electrical contacts 118 of the semiconductor die 104 is positioned within the connection region $C_r$. In some embodiments, the array of electrical contacts 118 may be in electrical communication with the array of contact pads 114. In some embodiments, the array of electrical contacts 118 is electrically isolated from the additional contact pads 116 coupled to the substrate 102. There may be one or more thermal contacts 120 coupled to the semiconductor die 104. The one or more thermal contacts 120 may be positioned within the peripheral region $P_r$ of the semiconductor device package 100. In some embodiments, the one or more thermal contacts 120 is in thermal communication with the one or more additional contact pads 116 of the substrate 102. In some embodiments, the semiconductor device package 100 includes two additional contact pads 116. One or more of the additional contact pads 116 may be connected to an electrical ground. In some embodiments, one or more of the additional contact pads 116 includes an electrical ground pad.

In some embodiments, the plate 106 may be a thermally conductive plate configured to transfer heat generated by one or more components of the semiconductor device package 100 (e.g., the semiconductor die 104) to a housing that the semiconductor device package 100 is coupled to and/or to the external environment. The plate 106 may be coupled to the top surface 105 of the semiconductor die 104. In some embodiments, plate 106 is disposed directly on and abuts top surface 105 of the semiconductor die 104. In some embodiments, the plate 106 covers substantially all of the top surface 105 of the semiconductor die 104. In some embodiments, plate 106 has a larger area than top surface 105 and extends beyond the edges of top surface 105. Although a single semiconductor die 104 is shown in FIGS. 1A-1B, it will be understood that additional semiconductor dies may be included and that the plate 106 may be coupled to the top surface of the uppermost semiconductor die. For example, the semiconductor device package 100 may include multiple semiconductor dies stacked one on top of another and the plate 106 may be coupled to the top surface of the uppermost semiconductor die in the die stack. The plate 106 may be comprised of one or more thermally conductive materials having a thermal conductivity that is greater than the thermal conductivity of any one of the encapsulant 108, substrate 102, and semiconductor die 104. For example, in some embodiments, the encapsulant 108 may have a thermal conductivity of less than 1 W/m·K to about 10 W/m·K, whereas the one or more thermally conductive materials of the plate 106 may have a thermal conductivity greater than 147 W/m·K. In some embodiments, the plate 106 is comprised of one or more thermally conductive materials that have a thermal conductivity within a range of about 100 W/m·K to about 600 W/m·K, for example, about 300 W/m·K to about 500 W/m·K. It will be understood that "thermally conductive" when describing a material and/or a component of the semiconductor device package 100, and any other semiconductor device described herein, refers to a material and/or component having a thermal conductivity that is at least or greater than 100 W/m·K. In some embodiments, "thermally conductive" refers to materials having a thermal conductivity that is greater than the thermal conductivity of pure silicon.

In some embodiments, the one or more thermally conductive materials that make up plate 106 includes or consists of a pure metal or metal alloy. In some embodiments, the one or more thermally conductive materials includes or consists of pure copper or a copper alloy, for example. The copper or copper alloy may have a thermal conductivity greater than 300 W/m·K (e.g., about 397 W/m·K). In some embodiments, the one or more thermally conductive materials includes or consists of aluminum or an aluminum alloy. In some embodiments, the one or more thermally conductive materials includes or consists of a precious metal or alloy thereof (e.g., silver or gold). In some embodiments, the one or more thermally conductive materials includes or consists of silicon. In other embodiments the one or more thermally conductive materials includes or consists of a non-metallic material preferably having a thermal conductivity that is at least or greater than 100 W/m·K. In some embodiments, the one or more thermally conductive materials includes or consists of graphene, carbon nanotubes, diamond, and/or other forms of carbon.

In some embodiments, there is a channel 122 extending from the plate 106 to a respective additional contact pad 116 of the substrate 102. The channel 122 may be configured to transfer heat from the plate 106, through the channel 122, and to respective the additional contact pad 116. In some embodiments, one or more thermally conductive materials as described above is disposed within channel 122. For example, the channel 122 may define an inner side wall comprised of one or more thermally conductive materials (e.g., copper or copper alloy) that extends circumferentially around the channel 122. In some embodiments, the inner side wall of channel 122 may be coated or layered with one or more thermally conductive materials (e.g., copper or copper alloy). In other embodiments, channel 122 may be filled, at least partially, with one or more thermally conductive materials that extend to additional contact pad 116. The channel 122 may be positioned within the peripheral region $P_r$ of the semiconductor device package 100. The channel 122 may extend from the plate 106, and at least partially through the substrate 102 to a respective additional contact pad 116. In some embodiments, the channel 122 extends through the semiconductor die 104. In some embodiments, the channel 122 extends through a through silicon via (TSV) of the semiconductor die 104. In some embodiments, the channel 122 may be electrically isolated from the semiconductor die and/or the array of contact pads 114. In some embodiments, the semiconductor device package 100 includes two channels 122 that are generally the same as one another. In some embodiments, the two channels 122 may be positioned opposite one another on the semiconductor device package 100. In some embodiments, the semiconductor device package 100 includes more than two channels 122.

In some embodiments, the channel 122 is hollow such that a pin 124 coupled to the plate 106 may extend at least partially therethrough. The pin 124 may be comprised of one or more thermally conductive materials as described above. In some embodiments, pin 124 is made of the same material as plate 106. In some embodiments, pin 124 and plate 106 are integrally formed. In some embodiments, the pin 124 such that it may be disposed within the channel 122 and directly contact the thermally conductive material disposed within channel 122. In some embodiments, the pin 124 such that it may be disposed within the channel 122 and directly contact the inner side walls defined by the channel 122. In this manner, the pin 124 may transfer heat from the plate 106 to the channel 122. In some embodiments, the pin 124 extends partially through the channel 122 and the semiconductor die 104. In other embodiments, the pin 124 extend from the plate 106, through the channel 122 and to the respective additional contact pad 116. In some embodiments, the semiconductor device package 100 includes two pins 124, each positioned within a respective channel 122. The two pins 124 may be generally the same as one another. In some embodiments, each of the two pins 124 may extend from the plate 106, through the respective channel 122, and contact a respective additional pad 116. In some embodiments, the semiconductor device package 100 includes more than two pins 124, each extending through a respective channel 122. In some embodiments, the pin 124 is integrally formed with the plate 106.

In some embodiments, the semiconductor device package 100 has a package thickness $t_T$ as measured from a plane defined by the bottom of the electrical contacts 115 and additional contacts 117 to the top planar surface 105 of the semiconductor die 104 and/or the top planar surface of the encapsulant 108. The plate 106 may have a plate thickness $t_P$ as measured from a bottom planar surface of the plate 106 to the top planar surface of the plate 106. In some embodiments, the plate thickness $t_P$ is between about 10% to about 40% of the package thickness $t_T$. In some embodiments, the plate thickness $t_P$ is about 25% the package thickness $t_T$. In some embodiments, the package thickness tris between about 0.5 mm to about 2.5 mm. In some embodiments, the pins 124 and/or channels 122 may have a diameter that is equal to or less than the plate thickness $t_P$. For example, the pins 124 and/or channel 122 may have a thickness that is between about 25% of the plate thickness $t_P$ to about 100% of the plate thickness $t_P$.

Figure 2:
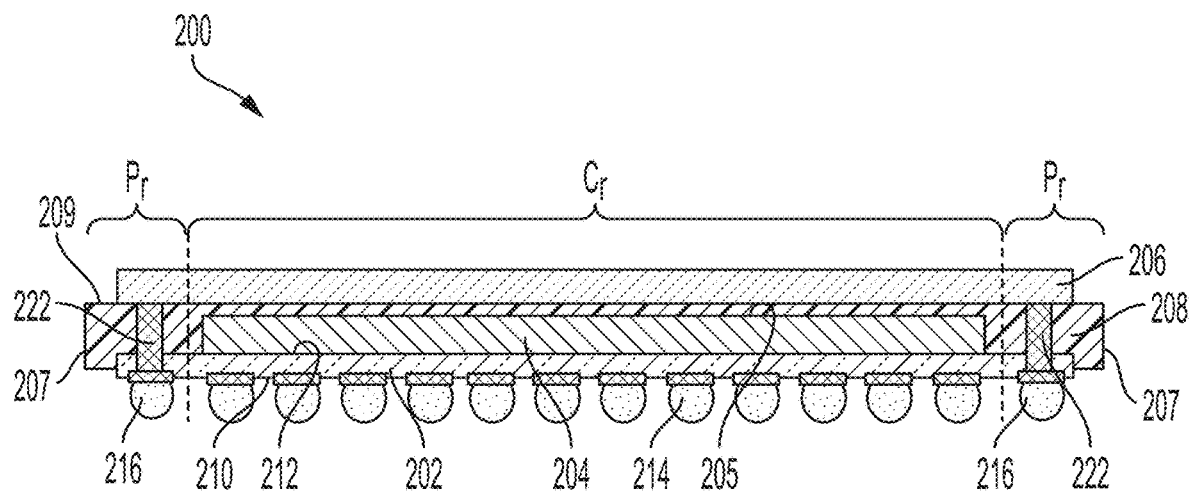
FIG. 2 is a side cross-sectional illustration of a semiconductor device package having a semiconductor device and a thermally conductive plate coupled thereto in accordance with another exemplary embodiment of the present disclosure.

Referring to FIG. 2, there is shown a semiconductor device package, generally designated 200, having a thermally conductive layer coupled thereto, in accordance with another exemplary embodiment of the present disclosure. The semiconductor device package 200 may be similar to semiconductor device package 100, discussed above, except that the channels 222 may not extend through the semiconductor die 204. For example, the semiconductor device package 200 may include a substrate 202, semiconductor die 204, and plate 206 that are similar to the corresponding components of the semiconductor device package 100. The substrate 202 may include a first surface 210 and a second surface 212 opposite the first surface 210. The semiconductor die 204 may be coupled to the second surface 212 of the substrate 202. In some embodiments, the semiconductor die 204 is coupled to the substrate 202 via a die attach film (DAF), not shown. In other embodiments, the semiconductor die 204 may be a flip-chip die and may be coupled to the substrate 202 in the corresponding manner.

The semiconductor die 204 may be positioned within the connection region $C_r$ of the semiconductor device package 200. In some embodiments, the semiconductor die 204 does not directly contact plate 206. For example, there may be a layer of encapsulant 208 that extends between the top surface 205 of the semiconductor die 204 and the bottom surface of the plate 206. In other embodiments, the top surface 205 of the semiconductor die 204 directly contacts the plate 206. There may be an array of contact pads 214 positioned within the connection region $C_r$ and one or more other contact pads 216 positioned within the peripheral region $P_r$. The array of contact pads 214 and the one or more other contact pads 216 may be substantially the same as the contact pads 114, and other contact pads 116, as described above with reference to FIGS. 1A-1B, and will not be described again for sake of brevity. The semiconductor device package 200 may include at least one channel 222 that extends from the plate 206 and to the substrate 202. In some embodiments, the at least one channel 222 extends from the plate 206, through the encapsulant 208, and at least partially through the second surface 212 of the substrate 202 within the peripheral region $P_r$. The channel 222 may be substantially the same as channel 122, described above with reference to FIGS. 1A-1B, and will not be described again for sake of brevity.

In some embodiments, the encapsulant 208 covers the semiconductor die 204 and at least a portion of the peripheral region $P_r$ of the semiconductor device package 200. The encapsulant 208 may have an outer surface including a top surface 209 and a plurality of side surfaces 207. Each of the side surfaces 207 may be substantially perpendicular to the top surface 209. The plate 206 may be coupled to the top surface 209 of the encapsulant. In some embodiments, the plate 206 covers at least a portion of the top surface 209 of the encapsulant 208. In some embodiments, the plate 206 covers the entire top surface 209 of the encapsulant 208.

Figure 3:
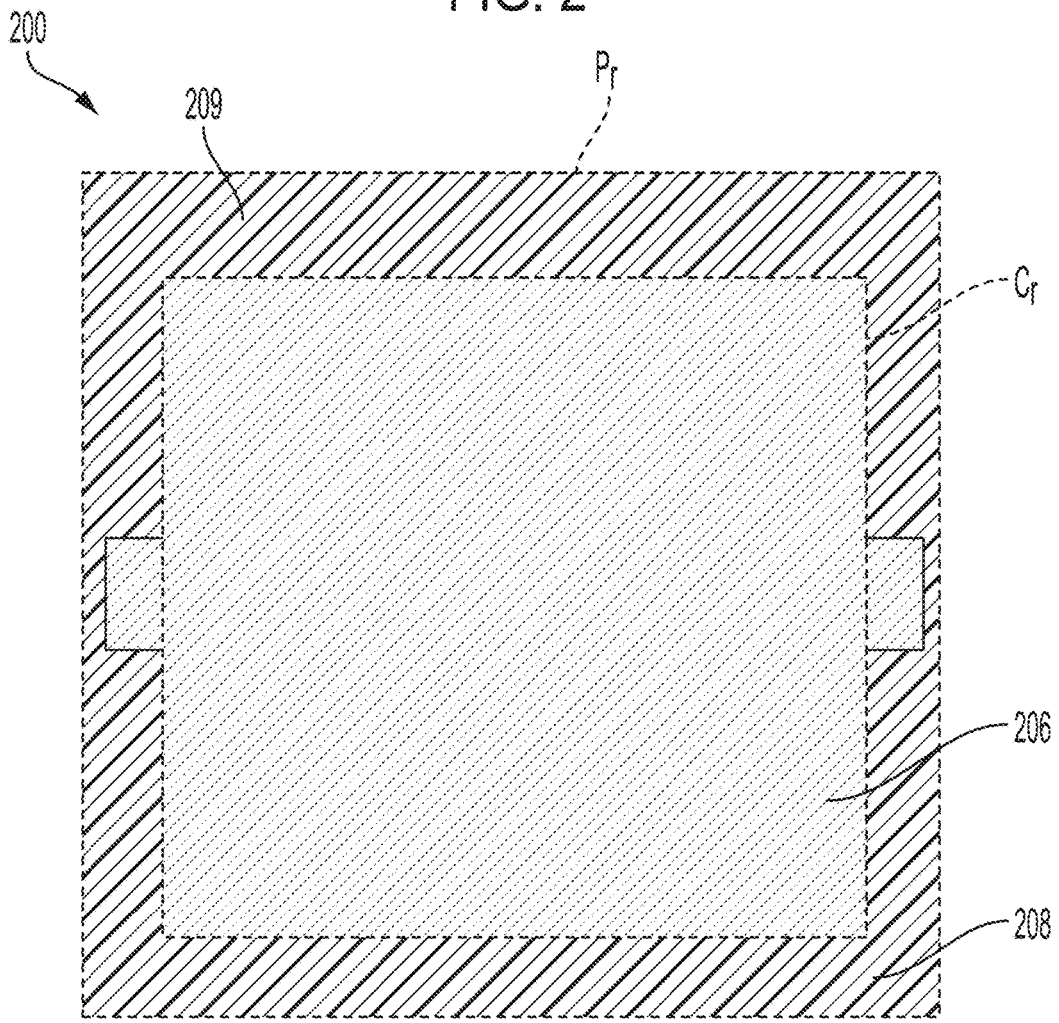
FIG. 3 is a top elevational illustration of the semiconductor device package of FIG. 2.
Figure 4:
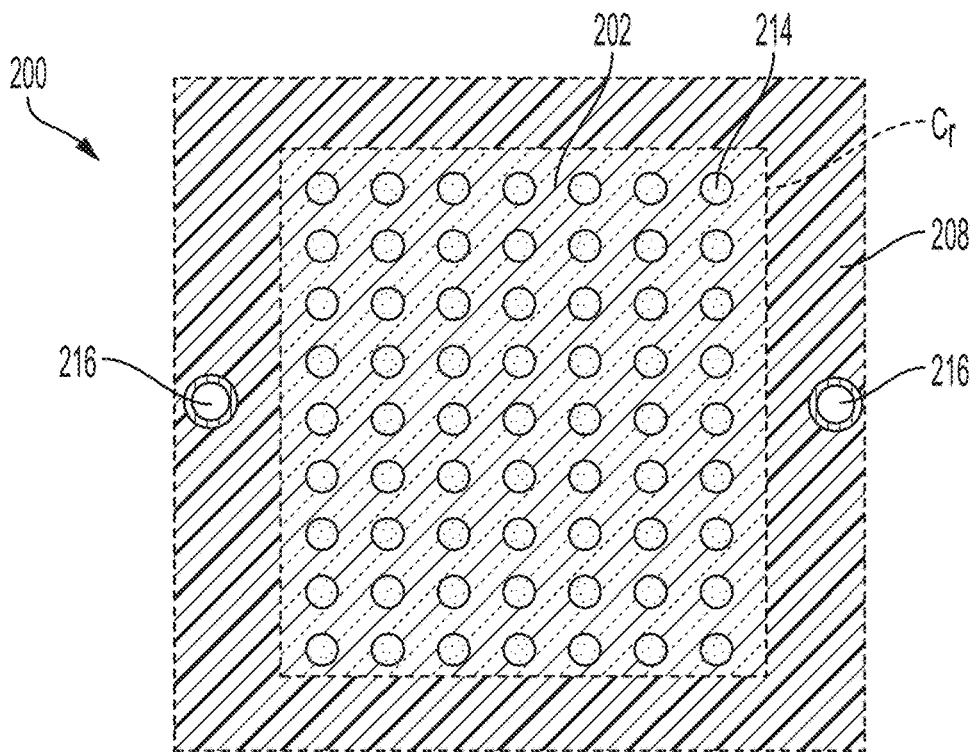
FIG. 4 is a bottom elevational illustration of the semiconductor device package of FIG. 2.

Referring to FIGS. 3-4, the plate 206 may substantially cover the top surface 209 of the encapsulant 208 that is within the connection region $C_r$. A layer of encapsulant material may therefore be disposed between top surface 205 of the semiconductor die 204 and the plate 206. In some embodiments, a portion of the plate 206 extends from the connection region $C_r$ and partially covers the peripheral region $P_r$. The portions of the plate 206 that are within the connection region $C_r$ and peripheral region $P_r$ may be integrally formed. The plate 206 may be comprised of one or more thermally conductive materials, as described above with reference to FIGS. 1A-1B. In some embodiments, a substantial portion of the substrate 202 is positioned within the connection region $C_r$. In some embodiments, a portion of the substrate 202 is positioned within the peripheral region $P_r$. The portion of the substrate 202 positioned within the peripheral region $P_r$ may be partially encapsulated by the encapsulant 208. In some embodiments, a portion of the substrate 202 proximate the one or more additional contact pads 216 is exposed at a bottom surface of the encapsulant 208. Similarly, the additional contact pads 216 may be exposed at the bottom surface of the encapsulant such that they may be coupled to an external device.

Figure 5:
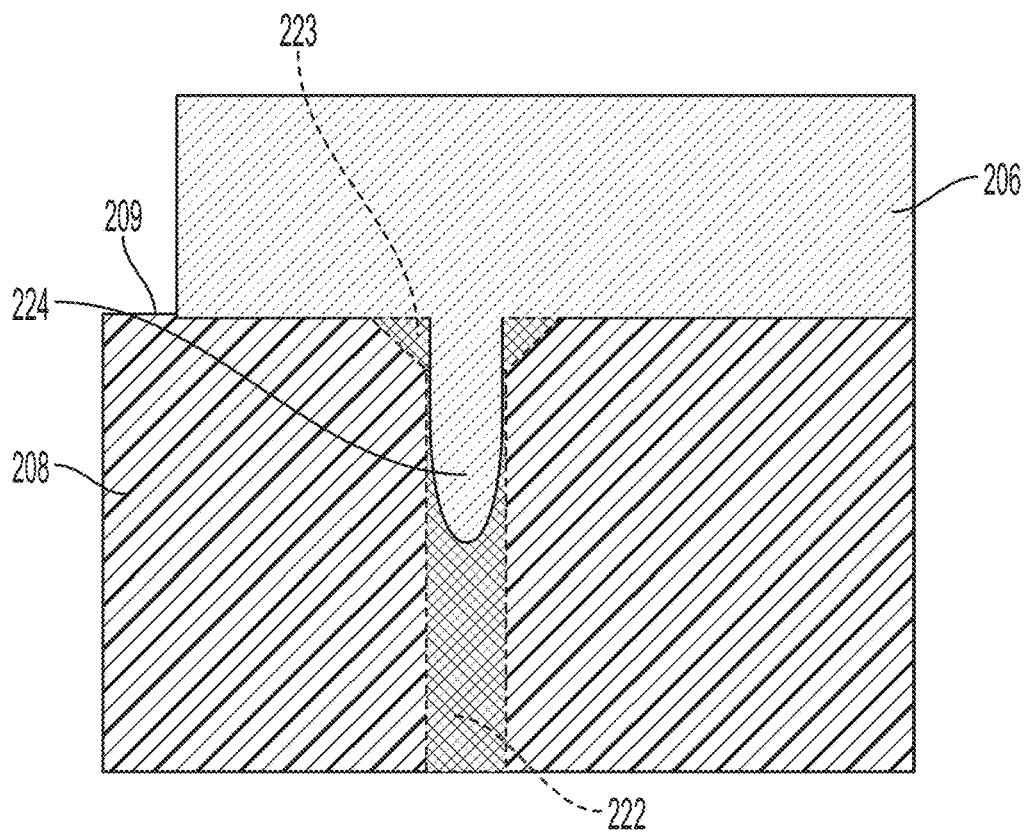
FIG. 5 is a magnified cross-sectional illustration of the semiconductor device package of FIG. 2.

Plate 206 may include at least one pin 224 configured to be inserted into the channel 222. The at least one pin 224 may be made from the same material as plate 206, and may be integrally formed with plate 206. In some embodiments, for example, plate 206 and the at least one pin 224 are both made from the same thermally conductive material, e.g., copper or copper alloy. Referring to FIG. 5, one or more of the channels 222 may include a widened opening to facilitate easy insertion of the pin 224 into the channel 222. The pin 224 may be coupled to the plate 206 and project from the plate 206 toward the substrate 202. The pin 224 may be substantially the same as pin 124 described above with reference to FIGS. 1A-1B, and will not be described again for sake of brevity. The channel 222 may include an opening 223 proximate the top surface 209 of the encapsulant 208 to allow the pin 224 to pass therethrough. In some embodiments, the opening 223 has a generally frustoconical shape. Although not shown in FIGS. 1A-1B, it will be understood that the channel 122 may include an opening generally the same as opening 223. As discussed above, channel 222 may include one or more thermally conductive materials at least partially lining the internal wall of the channel 222. The pin 224 may be in contact with the thermally conductive material lining the internal wall of the respective channel 222. In some embodiments, the pin 224 extends through the length of the channel 222 such that the channel 222 is substantially filled by the pin 224.

Figure 6:
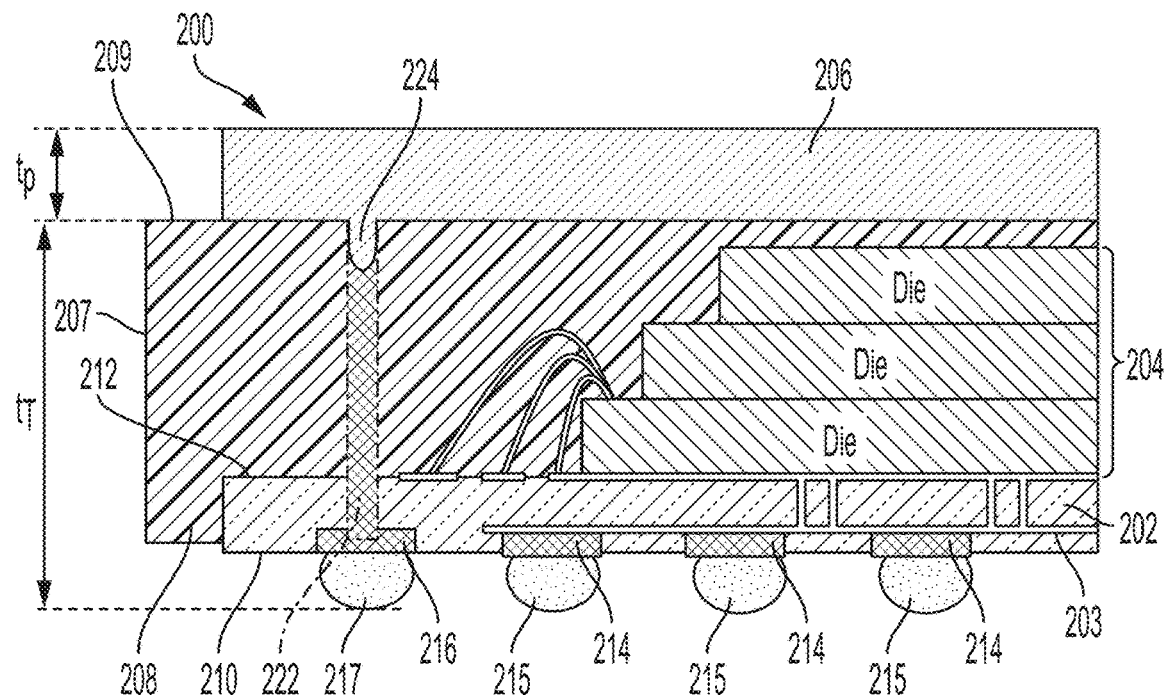
FIG. 6 is a magnified cross-sectional illustration of the semiconductor device package of FIG. 2 including semiconductor dies encapsulated by the molding compound.

Referring to FIG. 6, the semiconductor device package 200 may include multiple semiconductor dies 204 stacked one on top of another. The semiconductor dies 204 may be at least partially encapsulated within the encapsulant 208. In some embodiments, the semiconductor dies 204 may be electrically connected to one another via one or more bond wires (not shown). The semiconductor dies 204 may be electrically connected to an one or more electrically conductive layers/traces 203 disposed within the substrate 202. The electrically conductive layers/traces 203 may be substantially the same as traces 103 as discussed above with reference to FIGS. 1A-1B, and will not be described again for sake of brevity. In some embodiments, the semiconductor dies 204 may be in electrical communication with one or more electrical contacts 215 coupled to the first surface 210 of the substrate 202. The one or more electrical contacts 215 may be solder balls coupled to the first surface 210 of the substrate 202. In some embodiments, the one or more electrical contacts 215 is electrically connected to the substrate 202 via a corresponding contact pad 214 of the array of contact pads 214. The array of contact pads 214 may be electrically coupled to the one or more traces 203 of the substrate 202. In some embodiments, there is an electrical contact 215 coupled to each contact pad 214 of the array of contact pads 214. The at least one electrical contact 215 may be disposed within the connection region $C_r$.

In some embodiments, there is at least one additional contact 217 disposed on the first surface 210 of the substrate 202. The at least one additional contact 217 may be coupled to the substrate 202 via a corresponding additional contact pad 216. In some embodiments, the at least one additional contact 217 and the corresponding additional contact pad 216 are positioned within the peripheral region $P_r$. In some embodiments, the at least one additional contact pad 216 is configured to provide thermal communication between the channel 222 and the at least one additional contact 217. For example, the channel 222 may extend from the plate 206 to the at least one additional contact pad 216. In this manner the channel 222 and the additional contact 217 may be in thermal communication. In some embodiments, the at least one additional contact 217 is a solder ball. In some embodiments, the at least one additional contact 217 is comprised of one or more thermally conductive materials, as discussed above. In some embodiments, the at least one additional contact 217 is electrically isolated from the at least one electrical contact 215 and/or the semiconductor die 204. In some embodiments, the semiconductor device package 200 has a package thickness $t_T$ as measured from a plane defined by the bottom of the electrical contacts 215 and additional contacts 217 to the top planar surface 209 of the encapsulant 208. The plate 206 may have a plate thickness $t_P$ as measured from a bottom planar surface of the plate 206 to the top planar surface of the plate 206. In some embodiments, the plate thickness $t_P$ is between about 10% to about 40% of the package thickness $t_T$. In some embodiments, the plate thickness $t_P$ is about 25% the package thickness $t_T$. In some embodiments, the package thickness tris between about 0.5 mm to about 2.5 mm. In some embodiments, the pins 224 and/or channels 222 may have a diameter that is equal to or less than the plate thickness $t_P$. For example, the pins 224 and/or channel 222 may have a thickness that is between about 25% of the plate thickness $t_P$ to about 100% of the plate thickness $t_P$.

Figure 7:
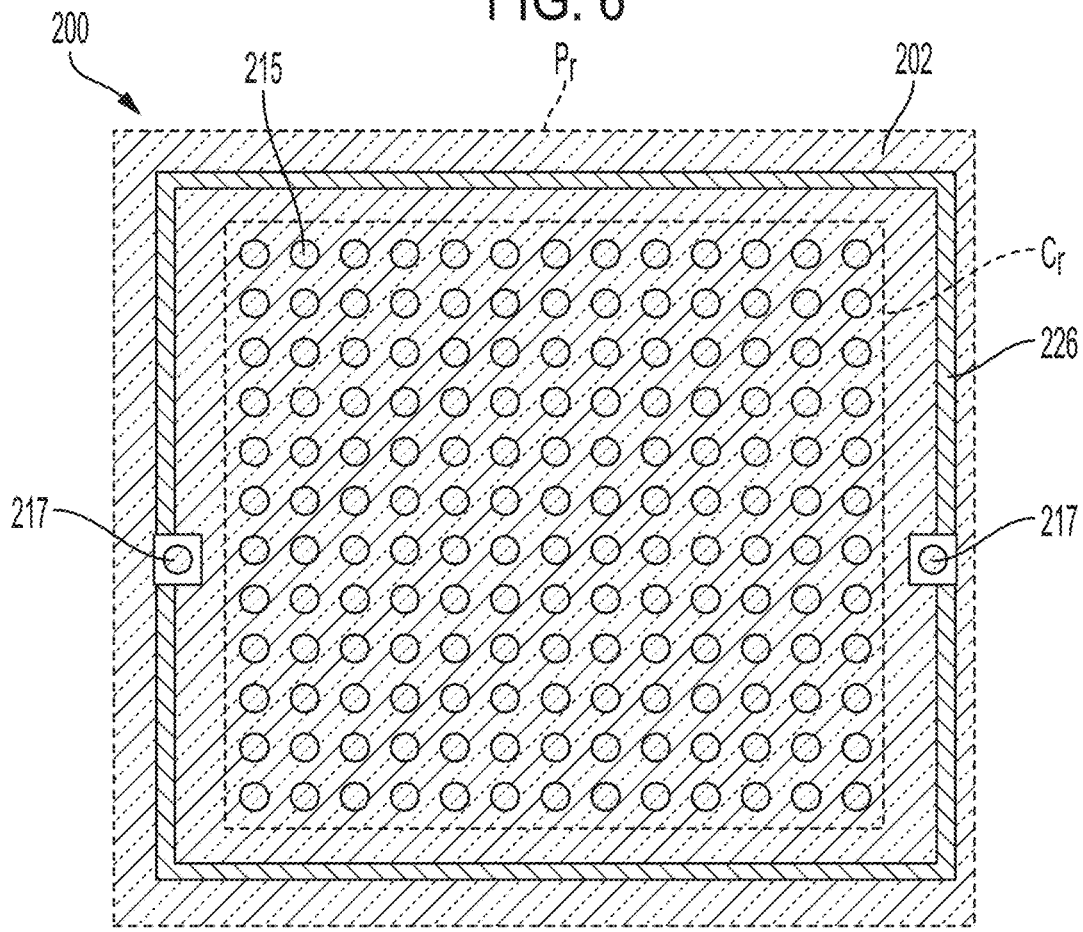
FIG. 7 is a bottom elevational illustration of the semiconductor device package of FIG. 2 including thermally conductive traces.

Referring to FIG. 7, the semiconductor device package 200 may include a device thermal trace 226 extending between the additional contacts 217. For example, the semiconductor device package 200 may include two or more additional contacts 217, each in thermal communication with the plate 206 via a respective channel 222. The additional contacts 217 may be configured to allow heat to be transferred from the plate 206, through the pin 224 and channel 222 to the additional contact 217 such that the heat may be transferred to a housing containing the semiconductor device package 200 and/or to the external environment. In this manner the heat may be dissipated along a larger surface area thereby improving the heat dissipation of the semiconductor device package 200. There may be one or more device thermal traces 226 extending between the two additional contacts 217. In some embodiments, the device thermal traces 226 are positioned within the peripheral region $P_r$ such that the device thermal traces 226 do not extend into the connection region $C_r$.

Figure 8:
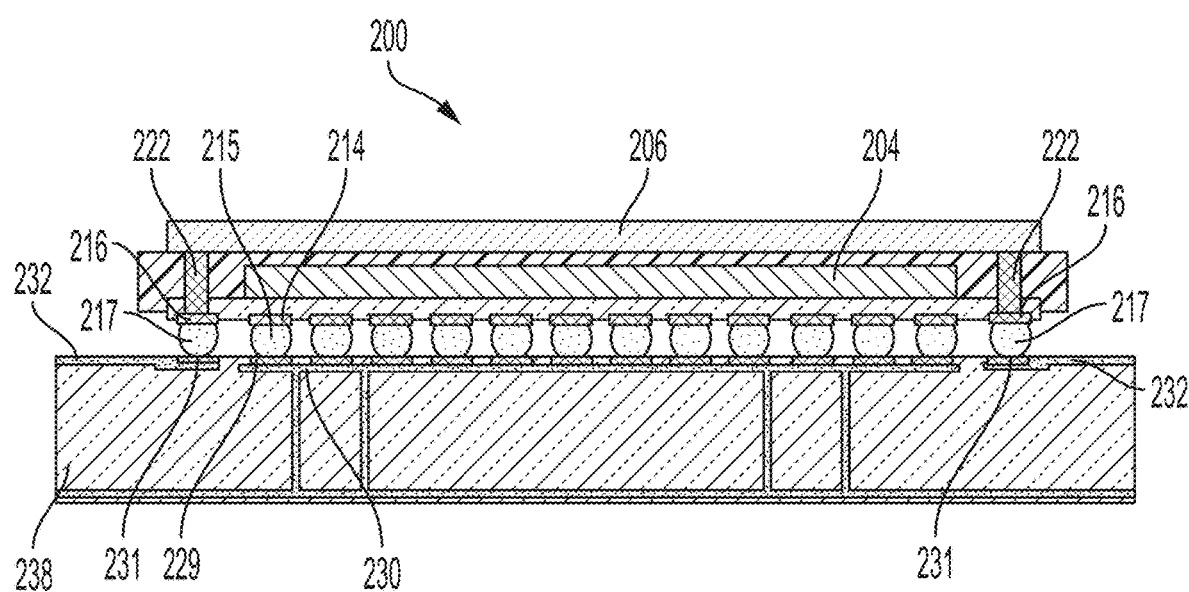
FIG. 8 is a side cross-sectional illustration of the semiconductor device package of FIG. 2 coupled to a second substrate.

Referring to FIG. 8, in some embodiments the semiconductor device package 200 is configured to couple to a second substrate 228. The second substrate 228 may be a printed circuit board (PCB) configured to electrically and/or thermally couple one or more other semiconductor devices to the second substrate 228. In some embodiments, the second substrate 228 includes one or more signal traces 230 to transmitting electrical signals to and from the semiconductor device package 200. In some embodiments, the one or more signal traces 230 are in electrical communication with the semiconductor die 204 of the semiconductor device package 200. For example, the one or more signal traces 230 may be in electrical communication with the at least one electrical contact 215 such that the one or more signal traces 230 are in electrical communication with the semiconductor die(s) 204. In some embodiments, the at least one electrical contact 215 is a first set of solder balls that includes a solder ball electrically and mechanically connected to a corresponding contact pad 214. In some embodiments, the second substrate 228 includes a first set of bond pads 229 configured to receive the electrical contacts 215 (e.g., the first set of solder balls). For example, the first set of bond pads 229 may be positioned on the substrate 228 such that they directly contact the electrical contacts 215. In some embodiments, the first set of bond pads 229 is electrically connected to the one or more signal traces 228.

In some embodiments, the second substrate 228 includes one or more thermal traces 232 electrically isolated from the one or more signal traces 230. In some embodiments, the one or more additional contacts 217 of the semiconductor device package 200 are configured to provide thermal communication between the plate 206 and the one or more thermal traces 232 of the second substrate 228. For example, the one or more additional contacts 217 may be a second set of solder balls that are connected to the one or more thermal traces 232. In some embodiments, the second substrate 228 may include a second set of bond pads 231 configured to connect the one or more additional contacts 217 (e.g., the second set of solder balls) to the one or more thermal traces 232. For example, the second set of bond pads 231 may be directly connected to the one or more thermal traces 232. In some embodiments, the one or more thermal traces 231 may at least partially surround the first set of bond pads 229 on the second substrate 228. The first set of bond pads 229 and/or second set of bond pads 231 may be any type of standard solder pad. For example, and without limiting the foregoing sentence, the first set of bond pads 229 and/or second set of bond pads 231 may be solder mask defined or non-solder mask defined bond pads.

Figure 9:
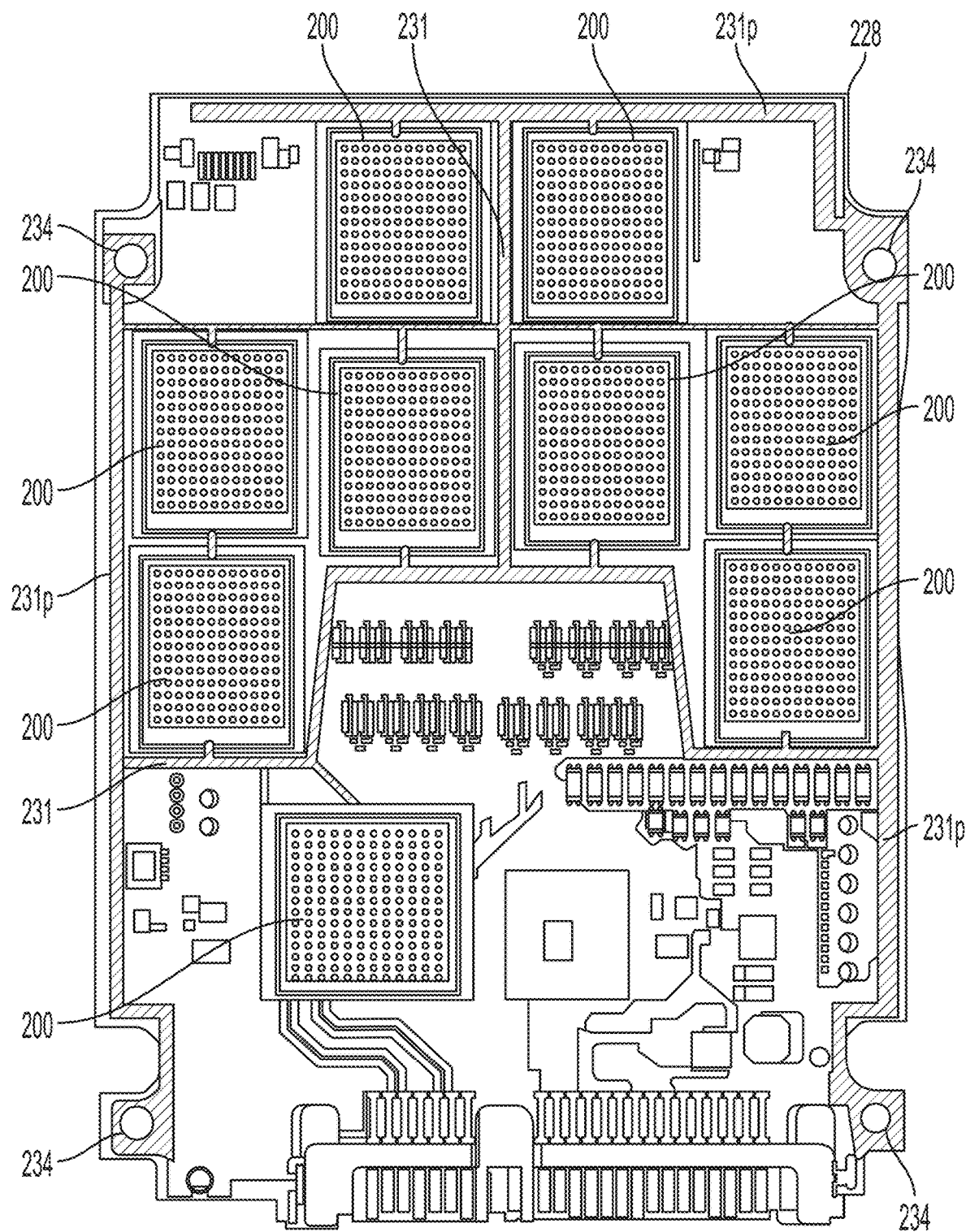
FIG. 9 is a top elevational illustration of a plurality of semiconductor device packages coupled to the second substrate of FIG. 8.

Referring to FIG. 9, there is shown a top elevational illustration of the second substrate 228 having multiple semiconductor devices 200 coupled thereto. In some embodiments, each of the semiconductor devices 200 is in thermal communication with at least one of the thermal traces 231 of the second substrate 228. In some embodiments, the one or more thermal traces 231 are exposed at the top planar surface of the second substrate 228. In some embodiments, the one or more thermal traces 231 includes one or more peripheral thermal traces 231$p$. The peripheral thermal traces 231 may be positioned on the second substrate 228 proximate a periphery of the second substrate 228. It will be understood that the peripheral thermal traces 231$p$ and remaining thermal traces 231 are substantially similar except that the peripheral thermal traces 231$p$ are positioned proximate the periphery of the second substrate 228. As such, the thermal traces 231 and peripheral thermal traces 231$p$ may be in thermal communication with one another. In this manner, the thermal traces 231 may provide a thermally conductive pathway from the semiconductor devices 200 to the peripheral thermal traces 231$p$.

The second substrate 228 may include one or more fastener holes 234 configured to receive a fastener (e.g., a screw, bolt) for coupling the second substrate 228 to a housing. In some embodiments, at least one of the thermal traces 231 is in thermal communication with at least one fastener hole 234 of the second substrate 228. For example, the peripheral thermal traces 231$p$ may be in contact with one or more fastener holes 234. In some embodiments, each fastener hole 234 is in direct contact with at least a portion of a peripheral thermal trace 231$p$. For example, each peripheral thermal trace 231$p$ may include a portion that abuts at least one fastener hole 234. In this manner, the peripheral thermal traces 231$p$ may provide a thermal pathway from the semiconductor devices 200 to the fastener holes 234. In FIG. 9, the second substrate includes four fastener holes 234, however, it will be understood that the second substrate 200 may include fewer than four or greater than four fastener holes 234.

Figure 10:
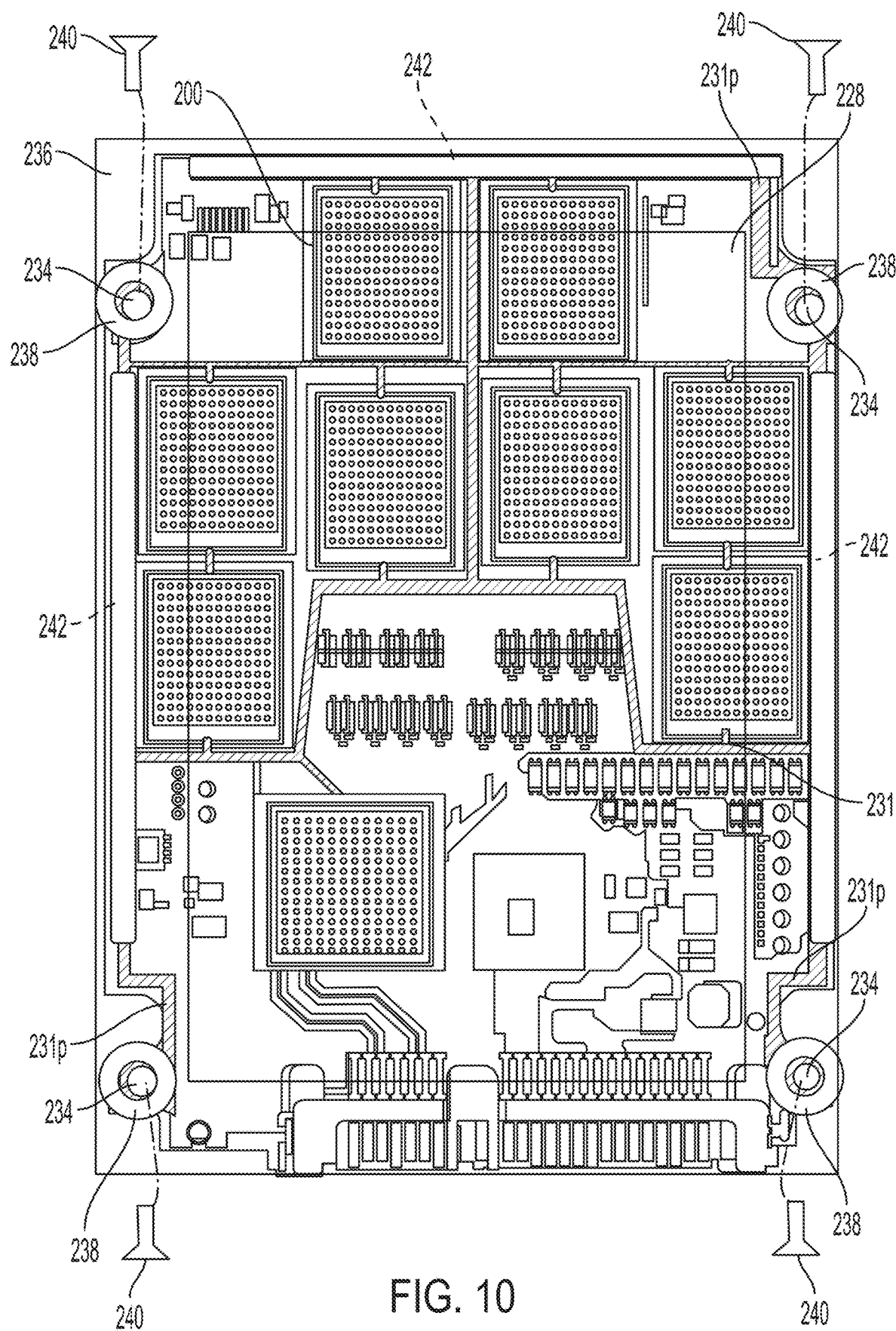
FIG. 10 is a top elevational illustration of the plurality of semiconductor device packages and second substrate of FIG. 8 coupled to a device housing.

Referring to FIG. 10, there may be a housing 236 coupled to the second substrate 228. The housing 236 may be any housing or enclosure configured to receive the second substrate 228, and the semiconductor dies 200 that are coupled thereto. The housing 236 may at least partially enclose the second substrate 228 and the components coupled thereto. For example, the housing 236 may at least partially enclose the semiconductor dies 204 and substrate 202 of the semiconductor devices 200 and may partially enclose the second substrate 228. FIG. 10 is a top-elevational cross-sectional illustration of the housing 236 coupled to the second substrate 228, thereby illustrating the housing 236 as partially covering a peripheral portion of the second substrate 228 while not covering the portion of the second substrate 228 interior to said peripheral portion. It will be understood, however, that the housing 236 may entirely enclose the second substrate 228. In some embodiments, the housing 236 may include one or more apertures or ports (not shown) in electrical communication with the second substrate 228 to facilitate the electrical coupling of the second substrate 228, and the semiconductor devices 200 coupled thereto, to an external device.

In some embodiments, the one or more thermal traces 231 provide a thermally conductive pathway from the at least one thermal contact 217 (shown in FIG. 8) of each semiconductor device package 200 to the housing 236. For example, and as described above with reference to FIG. 8, the thermal contacts 217 of each semiconductor device package 200 are in thermal communication with the one or more thermal traces 231 of the second substrate 228. The thermal traces 231 provide a thermally conductive pathway from the semiconductor devices 200 to the peripheral thermal traces 231*p* that each include a portion that abuts the fastener holes 234. The housing 236 may include one or more apertures 238 configured to align with the one or more fastener holes 234 such that a fastener 240 (e.g., a screw, bolt) may pass through the apertures 238 and the fastener holes 234 thereby fixedly coupling the housing 236 to the second substrate 228.

In some embodiments, the housing 236 is secured to the second substrate 228 by at least one fastener 240. The at least one fastener 240 may be comprised of one or more thermally conductive materials. In some embodiments, the at least one fastener 240 is in thermal communication with the thermal traces 231 when the fastener 240 is received in the fastener hole 234. For example, the fastener 240 may at least partially abut the fastener hole 234 thereby creating a thermally conductive pathway from the one or more thermal traces 231 to the fastener 240 via the peripheral thermal traces 231*p* and fastener holes 234. In this manner, heat may be transferred from the semiconductor devices 200, through the thermal traces 231, 231*p* and through the fastener holes 234 to the housing 236 via the fasteners 240. In some embodiments, the fasteners 240 may be high force screws coupled to the housing 236 and second substrate 228 to ensure a tight fit between the housing 236 and second substrate 228. In some embodiments, thermally conductive washers may be included between the fasteners 240 and housing 236 and/or substrate 236.

In some embodiments, the housing 236 includes one or more additional thermal contact areas 242 configured to at least partially abut the peripheral thermal traces 231*p* of the second substrate 228. For example, the housing 236 may include thermal contact areas 242 positioned along the housing 236 such that when the housing 236 is secured to the substrate 228, via fasteners 240, the additional thermal contact areas 242 abut a portion of the peripheral thermal traces 231*p*. In this manner, the surface area upon which heat is transferred from the second substrate 228 to the housing 236 may be increased, thereby increasing the heat dissipation capabilities of the second substrate 228. In some embodiments, the housing 236 may include a single additional thermal contact area 242 configured to at least partially abut a corresponding peripheral thermal trace 231*p*. In other embodiments, the housing 236 includes the same number of additional thermal contact areas 242 as there are peripheral thermal traces 231*p*. For example, as shown in FIG. 10, there are three peripheral thermal traces 231*p* and three additional thermal contact areas 242.

By providing fasteners 240 and/or the additional thermal contact areas 242, the heat dissipation capabilities of the semiconductor devices 200 coupled to the substrate 228 may be improved. For example the fasteners 240 and/or the additional thermal contact areas 242 may transfer heat from the semiconductor devices 200 to the housing 236 where the heat may be dispersed along a larger surface area. In some embodiments, by providing thermally conductive pathways as described above the thermal conductivity and/or volume resistivity may be increased thereby improving the heat dissipation of heat generated by the semiconductor device(s) 200 when compared to conventional semiconductor devices and/or conventional semiconductor device packages.

Although the semiconductor devices illustrated in FIGS. 9-10 as being coupled to the second substrate 228 are semiconductor devices 200, it will be understood that one or more of the semiconductor devices coupled to the second substrate 228 may be semiconductor device package 100, described above with reference to FIGS. 1A-1B. For example, at least one of the semiconductor devices coupled to the second substrate 228 may be semiconductor device package 100 and at least one other semiconductor device coupled to the second substrate 228 may be semiconductor device package 200. In some embodiments, each of the semiconductor devices coupled to the substrate 228 are semiconductor devices 100.

Figure 11A:
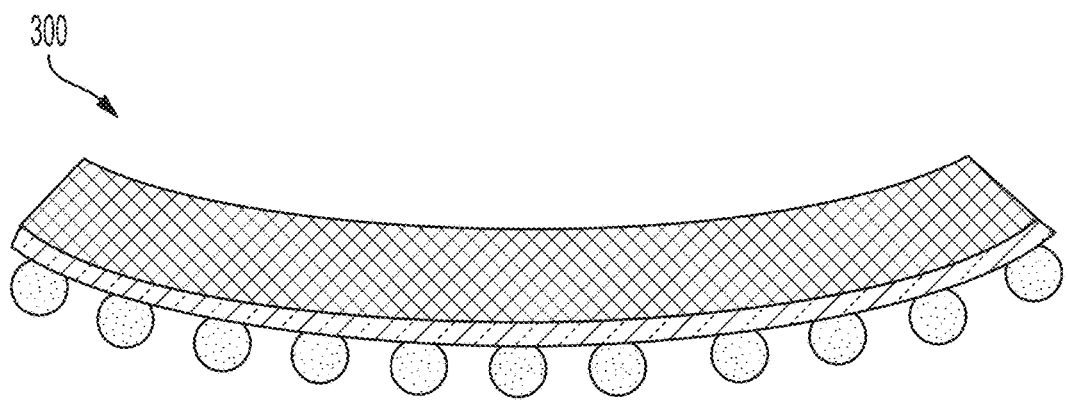
FIGS. 11A-11B are side cross-sectional illustrations of a semiconductor device package experiencing concave and convex warping.
Figure 11B:
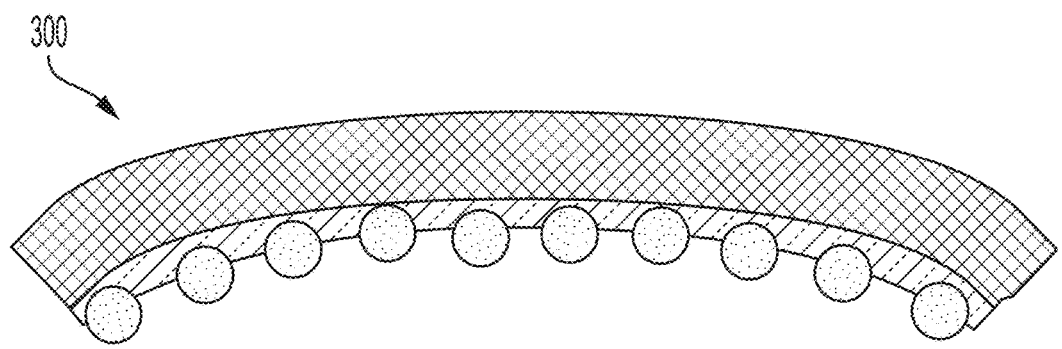

In some embodiments, excess heat buildup in a semiconductor device and/or semiconductor device package may cause the semiconductor device to warp. Warping of a semiconductor device may lead to defects in the semiconductor device such as, but not limited to, increased difficulty of mounting to a PCB, increased stress on the components of the semiconductor device leading to cracks or breaks in the components. Exposure to high temperatures or excessive heat may occur during assembly of a semiconductor device. FIGS. 11A-11B show example semiconductor devices 300 that have warped (curved) due to excess heat buildup and/or exposure to high temperatures. The curvatures in FIGS. 11A-11B are exaggerated for illustration. The high temperatures may be caused by a high temperature thermal application during the assembly of semiconductor device package 300 while the semiconductor device package 300 is being soldered. FIG. 11A illustrates the semiconductor device package 300 having a concave warp caused by soldering during the assembly of the semiconductor device package 300. Concave warping may cause, for example, the semiconductor device to have insufficient contact points at or proximal the outer edges of the semiconductor device package 300. FIG. 11B illustrates the semiconductor device package 300 having a convex warping caused by soldering during the assembly of the semiconductor device package 300. Convex warping may lead to electrical shorts and bridging at the edges of the semiconductor device package 300.

Figure 12:
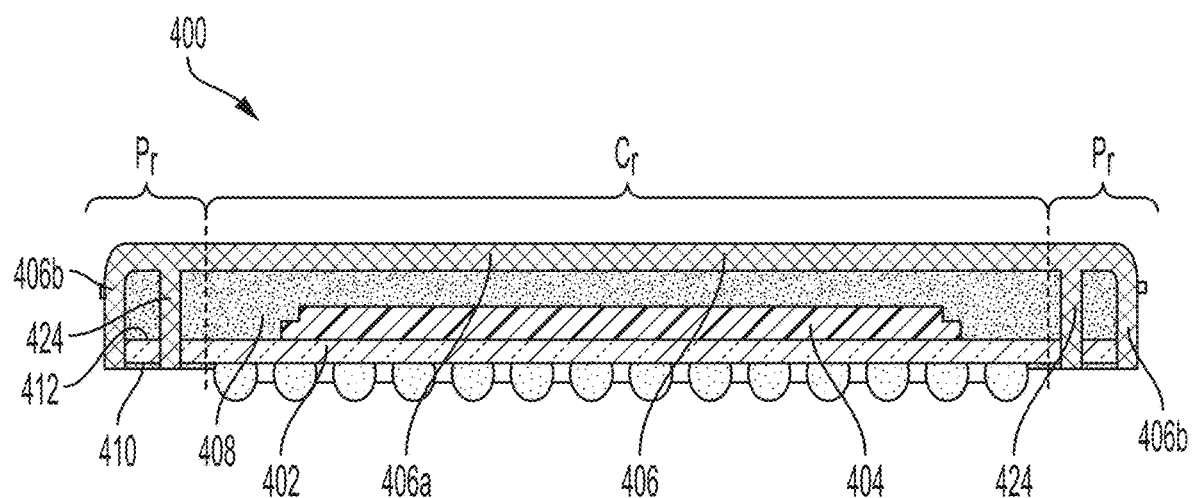
FIG. 12 is a side cross-sectional illustration of a semiconductor device package having a semiconductor device and a plate coupled thereto in accordance with another exemplary embodiment of the present disclosure.
Figure 13:
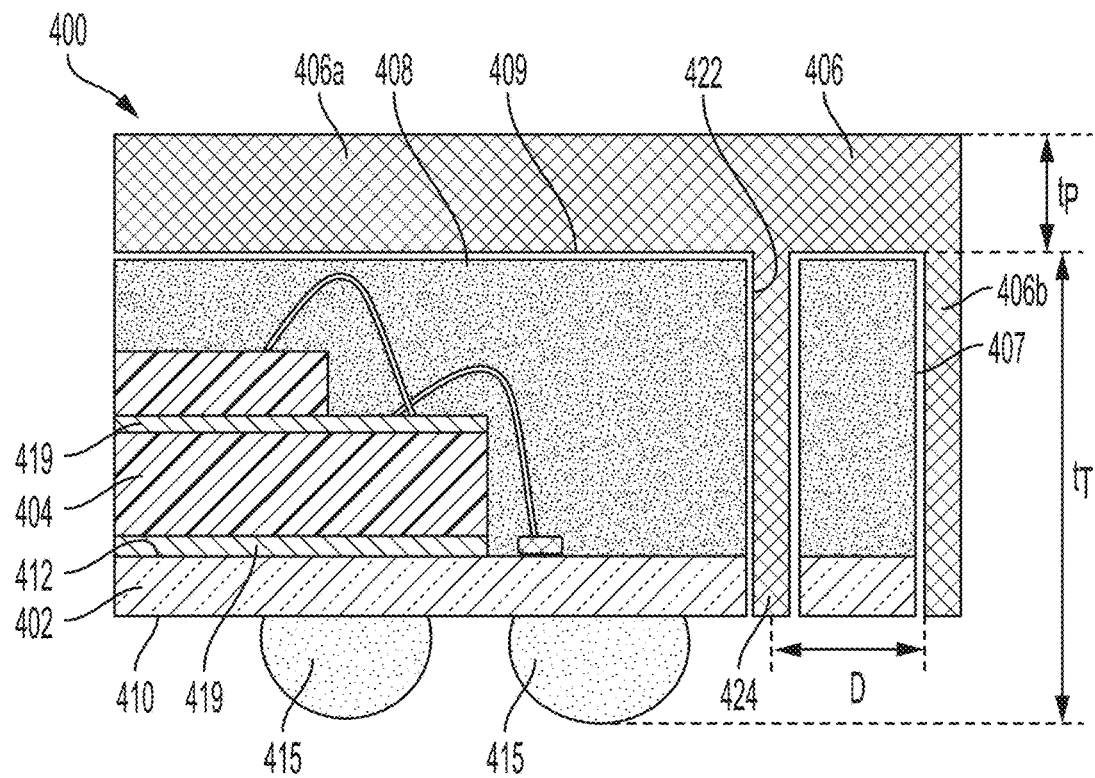
FIG. 13 is a magnified cross-sectional illustration of the semiconductor device package of FIG. 12.

Referring to FIGS. 12-13, there is shown a semiconductor device package, generally designated 400, having a reinforcement layer configured to reduce the occurrence of warping in accordance with another exemplary embodiment of the present disclosure. The semiconductor device package 400 may include a substrate 402 and one or more semiconductor dies 404 coupled to the substrate 402. The substrate 402 and semiconductor dies 404 may be generally the same as the substrate 202 and semiconductor dies 204 described above with reference to FIGS. 2-6. For example, the substrate 402 may include a first surface 410 and a second surface 412 opposite the first surface 410. The at least one semiconductor die 404 may be coupled to the second surface 412 of the substrate 402 and positioned within a connection region $C_r$. The semiconductor die 404 may be electrically connected to the substrate 402 via one or more bond wires and/or flip-chip mounting. The substrate 402 may include one or more metal layers or traces disposed within the substrate 402 and configured to transmit electrical signals to and from the one or more semiconductor dies 404. Similar to the semiconductor devices 100 and 200, the semiconductor device package 400 may have a peripheral region $P_r$ that surrounds the connection region $C_r$. The semiconductor die 404 may not extend into the peripheral region $P_r$. In some embodiments, there are one or more electrical contacts 415 coupled to the bottom planar surface 410 of the substrate 402. The electrical contacts may be positioned within the connection region $C_r$. The electrical contacts 415 may be substantially similar to the electrical contacts 215 described above with reference to FIGS. 2-6.

In some embodiments, the semiconductor device package 400 includes a reinforcement layer 406 at least partially covering an encapsulant 408. The reinforcement layer 406 may be configured to prevent the semiconductor device package 400 from warping due to exposure to high temperatures or at least reduce the amount of warping that may occur. The encapsulant 408 may at least partially cover the semiconductor die 404 and may be generally similar to the encapsulants 108 and 208 as described above. The encapsulant 408 may have an outer surface include a top surface 409 and a plurality of side surfaces 407 (see FIG. 13) that are substantially perpendicular to the side surface 407. In some embodiments, the reinforcement layer 406 is disposed over the outer surface of the encapsulant 408. In some embodiments, the encapsulant 408 covers the semiconductor die 404 and at least a portion of the peripheral region $P_r$. For example, the encapsulant 408 may cover the surface of the semiconductor die 404 that are not covered by the substrate 402 and may cover a portion of the peripheral region $P_r$ between the second surface 412 of the substrate 402 and the reinforcement layer 406.

The reinforcement layer 406 may include a plate 406a and a peripheral wall 406b. In some embodiments, the plate 406a is coupled to the top surface 409 of the encapsulant 408. The plate 406a may cover a substantial portion of the top surface 409 of the encapsulant 408. In some embodiments, the plate 406a covers the substantially all of the top surface 409 of the encapsulant 408. Put another way, a peripheral edge of the top surface 409 of the encapsulant 408 may be covered by the plate 406a. In some embodiments, the peripheral wall 406b of the reinforcement layer 406 extends from the plate 406a towards the substrate 402. The peripheral wall 406b may be substantially perpendicular to the plate 406a. In some embodiments, the peripheral wall 406b abuts the plurality of side surfaces 407 of the encapsulant 408. In some embodiments, the peripheral wall 406b extends from the top surface 409 of the encapsulant 408, along the side surface 407 of the encapsulant, and to the first surface 410 of the substrate 402. In some embodiments, the plate 406a and/or peripheral wall 406b are comprised of a material having a modulus of rigidity at least 30 GPa. In some embodiments, the plate 406a and peripheral wall 406b are integrally formed.

In some embodiments, the plate 406a may be similar to the plates 106 and 206 of semiconductor devices 100 and 200. For example, the plate 406a may be comprised of one or more thermally conductive materials (e.g., copper). In some embodiments, the plate 406a and peripheral wall 406b are comprised of the same material(s). The plate 406a and/or peripheral wall 406b may be configured to prevent, or at least reduce, the occurrence of warping of the semiconductor device package 400 due to exposure to high temperatures. For example, during soldering (e.g., reflow) the semiconductor device package 400 may be exposed to temperatures within a range of about 200 degrees Celsius to about 450 degrees Celsius. As such, one or more of the components of the semiconductor device package 400 (e.g., the substrate 402, semiconductor die 404, encapsulant 408, die attach films 419), when exposed to said temperatures, may undergo thermal expansion thereby exerting a force on the reinforcement layer 406. The reinforcement layer 406 (e.g., the plate 406a, peripheral wall 406b) may provide structural support and/or rigidity to the semiconductor device package 400 thereby resisting the forces resulting from the thermal expansion. In some embodiments, the peripheral wall 406b is configured to resist forces caused by thermal expansion that would result in a concave warping of the semiconductor device 400.

In some embodiments, the semiconductor device package 400 has a package thickness $t_T$ as measured from a plane defined by the bottom of the electrical contacts 415 to the top planar surface 409 of the encapsulant 408. The plate 406a may have a plate thickness $t_P$ as measured from a bottom planar surface of the plate 406a to the top planar surface of the plate 406a. In some embodiments, the plate thickness $t_P$ is between about 10% to about 40% of the package thickness $t_T$. In some embodiments, the plate thickness $t_P$ is about 25% the package thickness $t_T$. In some embodiments, the package thickness tris between about 0.5 mm to about 2.5 mm. In some embodiments, the plate thickness $t_P$ and modulus of rigidity of the plate 406a may be inversely related. For example, as the desired plate thickness $t_P$ decreases, the desired modulus of rigidity of the material(s) comprising the plate 406a may increase.

In some embodiments, the semiconductor device includes one or more pins 424 configured to limit the thermal expansion of the semiconductor device package 400. The pins 424 may be comprised of the same material(s) as the reinforcement layer 406. In some embodiments, the pins 424 extend from the plate 406a, through the encapsulant 408 and through the substrate 402. The pins 424 may be positioned within the peripheral region $P_r$. In some embodiments, the pins 424 are electrically isolated from the semiconductor device 404. The pins 424 may be similar to pins 124 and 224 in that the pins 424 may extend from the plate 406a through a channel 422 and may at least partially abut an inner side wall of the channel 422. Channel 422 may extend through the thickness of encapsulant 408, e.g., from top surface 409 to at least second surface 412 of the substrate 402. In some embodiments, channel 422 further extends through second surface 412 of the substrate 402 to first surface 410. The channel 422 may be better understood with reference to FIG. 13, which illustrates a portion of the semiconductor device package 400 in a partially exploded view. For example, the reinforcement layer 406 and pin 424 illustrated in FIG. 13 are illustrated as being spaced from the respective top surface 409 and side surface 407 of the encapsulant 408 and from the channel 422. In some embodiments, the pins 424 and/or channels 422 may have a diameter that is equal to or less than the plate thickness $t_P$. For example, the pins 124 and/or channel 122 may have a thickness that is between about 25% of the plate thickness $t_P$ to about 100% of the plate thickness $t_P$.

It will be understood, however, that the reinforcement layer 406 and pins 424 may abut the respective surfaces of the encapsulant 408 and channel 422, and that FIG. 13 is an illustration created to facilitate a better understanding of the exemplary embodiment discussed herein. In some embodiments, the pin 424 is sized to entirely fill the channel 422. In some embodiments, the pin 424 and/or channel 422 extend from the top surface 409 of the encapsulant, through the second surface 412 of the substrate 402 to the first surface 410 of the substrate. In some embodiments, the pins 424 are configured to resist forces exerted on the pins 424 as a result of thermal expansion of the semiconductor device 400. In some embodiments, the pins 424 are configured to resist forces caused by thermal expansion that would result in a convex warping of the semiconductor device 400. In some embodiments, the presence of pins 424 and peripheral wall 406b may help limit the expansion and/or contraction of the encapsulant material disposed between these components, thereby reducing the amount of warpage that may occur.

The pins 424 may be positioned between the semiconductor die 404 and the peripheral wall 406b. In some embodiments, the pins 424 are positioned between the semiconductor die 404 and a respective side surface 407 of the encapsulant 408. In some embodiments, an outer surface of the pins 424 may be spaced from an inner surface of the peripheral wall 406b and/or the side surface 407 of the encapsulant 408 by a distance D. Distance D may be measured from the center of pin 424 to the inner surface of the peripheral wall 406b. In some embodiments, the distance D is a predetermined amount. In some embodiments the distance D is between about 1.0 mm to about 3.0 mm. In other embodiments, the distance D is between about 1.5 mm to about 2.5 mm. In other embodiments, the distance D is dependent upon the overall length of the semiconductor device package 400. The overall length of the semiconductor device package 400 may be measured as the distance between opposing side surfaces 407 of the encapsulant 408 or opposing side surfaces of the substrate 402. In some embodiments, the distance D may be between about 6.25% to about 25% of the overall length of the semiconductor device package 400. In some embodiments, if the overall length of the semiconductor device package 400 exceeds a predetermined amount, one or more additional pins may be positioned between the semiconductor die 404 and the side surface 407 of the encapsulant. For example, if the overall length of the semiconductor device package 400 exceeds a predetermined threshold there may be a second pin positioned between pin 424 and the semiconductor die 404. In some embodiments, the distance D may be dependent on the pin grid array (PGA) or ball grid array (BGA) package specifications. For example, in some embodiments, the distance D is generally equal to the minimum outer pin center to package edge distance, as defined by a standard PGA or BGA package specification.

Figure 14:
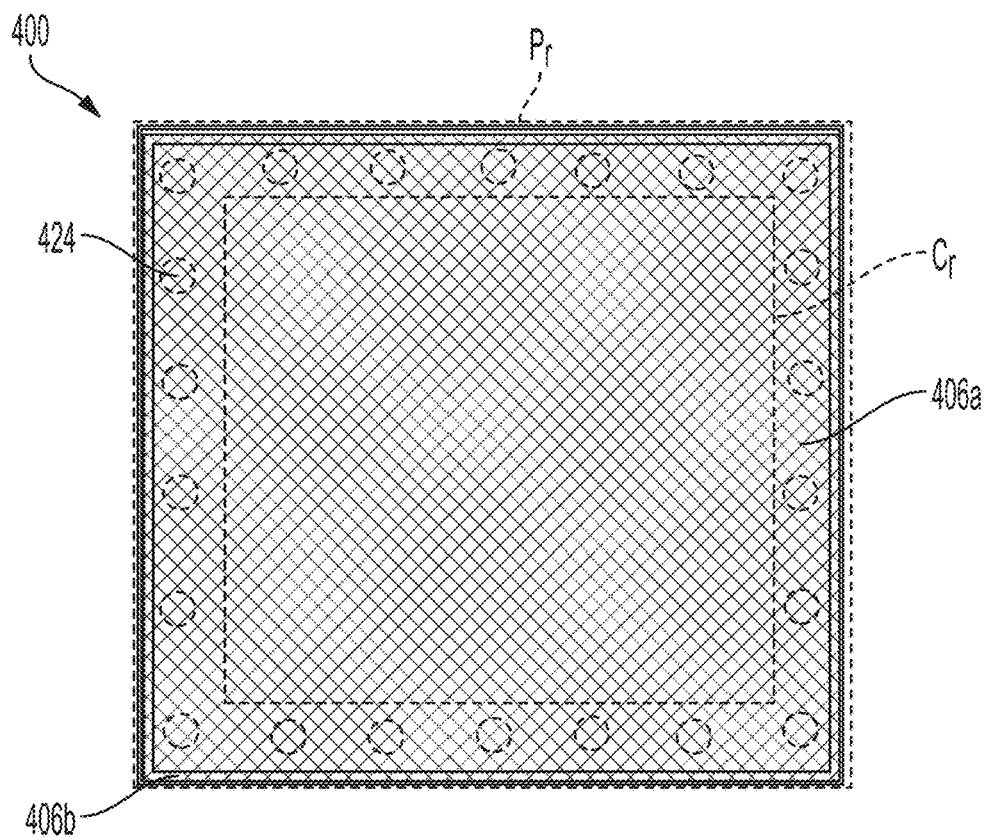
FIG. 14 is a top elevational illustration of the semiconductor device package of FIG. 12.
Figure 15:
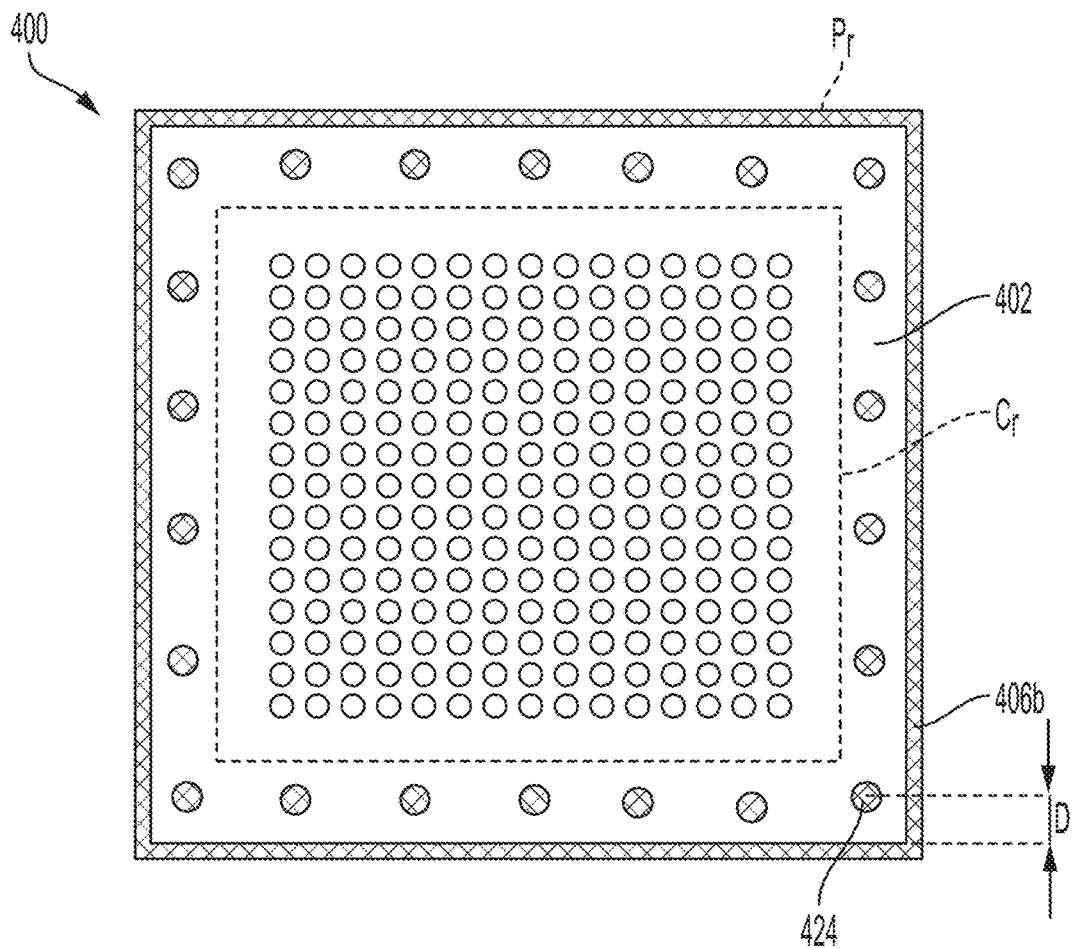
FIG. 15 is a bottom elevational illustration of the semiconductor device package of FIG. 12.

Referring to FIGS. 14-15, in some embodiments, the semiconductor device package 400 may include a plurality of pins 424 positioned within the peripheral region $P_r$. The plurality of pins 424 may be spaced from the semiconductor die 404 that is positioned within the connection region $C_r$. In some embodiments, each of the pins 424 projects from the plate 406a towards the substrate 402. In some embodiments, each of the pins 424 is spaced from one another by generally the same distance. In some embodiments, the semiconductor device package 400 includes at least one pin 424 positioned proximate each side surface 407 of the encapsulant 408. In some embodiments, the pins 424 may be generally equally spaced from one another and between opposing side surfaces 407 of the encapsulant 408. For example, if there is a single pin 424 positioned proximate a first side surface 407 of the encapsulant 408, the single pin 424 may be positioned generally equidistant from the side surfaces adjacent the first side surface 407 of the encapsulant. In some embodiments, as pins 424 are added proximate the first side surface 407 of the encapsulant 408, they may be equally spaced from one another on opposing sides of the first pin 424.

In some embodiments, the number of pins 424 positioned proximate any side surface 407 of the encapsulant 408 may be dependent upon the size and/or materials used in the semiconductor device package 400. For example, depending on the dimensions of and/or material(s) comprising the encapsulant 408 the number and/or diameter of the pins 424, if to great, may cause the encapsulant 408 to crack or fracture. Therefore, the number, size and/or placement of the pins 424 may be determined based on the dimensions and/or material(s) comprising the encapsulant 408, such that the pins 424 do not cause the encapsulant 408 to crack or facture. In this manner, the pins 424 may be configured to extend through the encapsulant 408 without causing the encapsulant 408 to crack or fracture.

Figure 16:
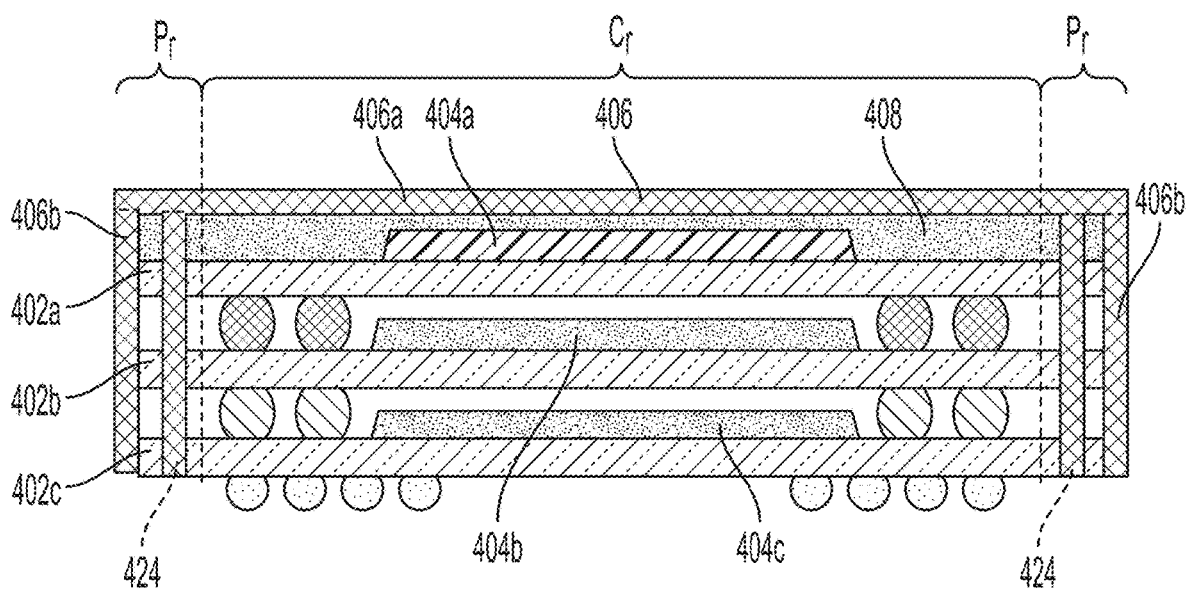
FIG. 16 is a side cross-sectional illustration of the semiconductor device package of FIG. 12 stacked on top of additional semiconductor devices.

Referring to FIG. 16, in some embodiments, the semiconductor device package 400 may include additional substrates and/or semiconductor dies stacked one upon the other. In some embodiments, the semiconductor device package 400 may include a first substrate 402a, second substrate 402b, and third substrate 402c. The first substrate 402a may be positioned above the second substrate 402b, which may be positioned above the third substrate 402c. Each of the substrates 402a-402c may be generally the same and may be substantially similar to substrate 402. There may be a first semiconductor die 404a, second semiconductor die 404b, and a third semiconductor die 404c each coupled to a respective substrate 404a-404c. In some embodiments, the first semiconductor die 404a is encapsulated within encapsulant 408. It will be understood, however, that any of semiconductor dies 404a-404c may be encapsulated within a respective encapsulant. The second semiconductor die 404b may be positioned on the second substrate 402b between the first substrate 402a and second substrate 402b. Similarly, the third semiconductor die 404c may be positioned on the third substrate 402c between the third substrate 402c and the second substrate 402b.

In some embodiments, the plate 406a of the reinforcement layer 406 covers the top surface of the encapsulant 408 and the peripheral wall 406b extends from the plate 406a to the third substrate 402c. The peripheral wall 406b may extend from the plate 406a to the bottom surface of the third substrate 402c. In this manner, the peripheral wall may entirely surround the periphery of each of the substrates 402a-402c. The pins 424 may extend from the plate 406a through one or more of the substrates 402a-402c. For example, the pins 424 may extend from the plate 406a through the first substrate 402a and through the second substrate 402b within the peripheral region $P_r$. In some embodiments, the pins 424 extend from the plate 406a through each of the substrates 402a-402c to the bottom surface of the bottom most substrate (e.g., the bottom surface of the third substrate 402c).

Although three substrates 402a-402c and three corresponding semiconductor dies 404a-404c are illustrated in FIG. 16, it will be understood that there may be fewer than or greater than three substrates and three semiconductor dies. For example, the semiconductor device package 400 may include the first substrate 402a and second substrate 402b and the corresponding semiconductor dies 404a-404b. The peripheral wall 406b and pins 424 may extend from the plate 406a, through each of the substrates 402a-402b, to the bottom surface of the bottom most substrate (e.g., substrate 402b).

It will be appreciated by those skilled in the art that changes could be made to the exemplary embodiments shown and described above without departing from the broad inventive concepts thereof. It is understood, therefore, that this invention is not limited to the exemplary embodiments shown and described, but it is intended to cover modifications within the spirit and scope of the present invention as defined by the claims. For example, specific features of the exemplary embodiments may or may not be part of the claimed invention and various features of the disclosed embodiments may be combined. The words "right", "left", "lower" and "upper" designate directions in the drawings to which reference is made. Unless specifically set forth herein, the terms "a", "an" and "the" are not limited to one element but instead should be read as meaning "at least one".

It is to be understood that at least some of the figures and descriptions of the invention have been simplified to focus on elements that are relevant for a clear understanding of the invention, while eliminating, for purposes of clarity, other elements that those of ordinary skill in the art will appreciate may also comprise a portion of the invention. However, because such elements are well known in the art, and because they do not necessarily facilitate a better understanding of the invention, a description of such elements is not provided herein.

Further, to the extent that the methods of the present invention do not rely on the particular order of steps set forth herein, the particular order of the steps should not be construed as limitation on the claims. Any claims directed to the methods of the present invention should not be limited to the performance of their steps in the order written, and one skilled in the art can readily appreciate that the steps may be varied and still remain within the spirit and scope of the present invention.

What is claimed is:

1. A semiconductor device package comprising:
   a first substrate including a first surface, and a second surface opposite the first surface, the first substrate having a connection region and a peripheral region surrounding the connection region;
   a semiconductor die electrically connected to the first substrate and positioned within the connection region of the first surface;
   an encapsulant covering the semiconductor die and at least a portion of the peripheral region, the encapsulant having an outer surface comprising a top surface and a plurality of side surfaces substantially perpendicular to the top surface;
   a plate coupled to the top surface of the encapsulant; and
   at least one pin projecting from the plate toward the first substrate, the at least one pin being disposed within a channel that extends through the encapsulant and at least partially through the second surface of the first substrate in the peripheral region, wherein the at least one pin is electrically isolated from the semiconductor die.

2. A semiconductor device package comprising:
   a first substrate including a first surface, and a second surface opposite the first surface, the first substrate having a connection region and a peripheral region surrounding the connection region;
   a semiconductor die electrically connected to the first substrate and positioned within the connection region of the first surface;
   an encapsulant covering the semiconductor die and at least a portion of the peripheral region, the encapsulant having an outer surface comprising a top surface and a plurality of side surfaces substantially perpendicular to the top surface;
   a plate coupled to the top surface of the encapsulant;
   at least one pin projecting from the plate toward the first substrate, the at least one pin being disposed within a channel that extends through the encapsulant and at least partially through the second surface of the first substrate in the peripheral region;
   a second substrate having one or more signal traces and one or more thermal traces, the one or more signal traces being electrically isolated from the one or more thermal traces;
   at least one contact disposed on the first surface of the first substrate within the connection region and configured to provide electrical communication between the semiconductor die and the one or more signal traces of the second substrate; and
   at least one additional contact disposed on the first surface of the first substrate within the peripheral region and configured to provide thermal communication between the plate and the one or more thermal traces of the second substrate.

3. The semiconductor device package of claim 2, wherein the at least one additional contact is connected to an additional contact pad on the first surface of the first substrate, and wherein the channel extends from the plate to the additional contact pad.

4. The semiconductor device package of claim 2, further comprising a thermally conductive material at least partially lining an internal wall of the channel, and wherein the at least one pin is in contact with the thermally conductive material.

5. The semiconductor device package of claim 2, wherein the at least one electrical contact comprises a first set of solder balls electrically coupled to the semiconductor die and the one or more signal traces, and wherein the at least one thermal contact comprises a second set of solder balls electrically isolated from the semiconductor die.

6. The semiconductor device package of claim 5, wherein the second substrate includes a first set of bond pads in direct contact with the first set of solder balls and a second set of bond pads in direct contact with the second set of solder balls, wherein the first set of bond pads is connected to the one or more signal traces, and wherein the second set of bond pads is connected to the one or more thermal traces.

7. The semiconductor device package of claim 6, wherein the one or more thermal traces at least partially surround the first set of bond pads on the second substrate.

8. The semiconductor device package of claim 2, further comprising a housing at least partially enclosing the semiconductor die, the first substrate, and the second substrate, and wherein the one or more thermal traces provide a thermally conductive pathway from the at least one thermal contact to the housing.

9. The semiconductor device package of claim 8, wherein the housing is secured to the second substrate by at least one fastener, wherein the second substrate includes at least one fastener hole for receiving the at least one fastener, and wherein the one or more thermal traces include a portion that abuts the at least one fastener hole.

10. The semiconductor device package of claim 9, wherein the at least one fastener is in thermal communication with the one or more thermal traces when the at least one fastener is received in the at least one fastener hole.

11. The semiconductor device package of claim 1, further comprising a thermally conductive material at least partially lining an internal wall of the channel, and wherein the at least one pin is in contact with the thermally conductive material.

12. The semiconductor device package of claim 1, further comprising at least one contact disposed on the first surface of the first substrate within the connection region, the at least one contact being in electrical communication with the semiconductor die.

13. The semiconductor device package of claim 12, further comprising at least one additional contact disposed on the first surface of the first substrate within the peripheral region, the at least one additional contact being in thermal communication with the plate through the channel.

14. The semiconductor device package of claim 13, wherein the at least one additional contact is electrically isolated from the at least one contact and the semiconductor die.

15. The semiconductor device package of claim 12, further comprising two or more additional contacts disposed on the first surface of the first substrate within the peripheral region, the two or more additional contacts each being in thermal communication with the plate and electrically isolated from the semiconductor die.

16. The semiconductor device package of claim 15, further comprising a thermal trace extending between the two or more additional contacts.

17. The semiconductor device package of claim 16, wherein the thermal trace is positioned within the peripheral region of the first substrate.

* * * * *